(12) United States Patent
Wirbeleit

(10) Patent No.: US 8,507,953 B2
(45) Date of Patent: Aug. 13, 2013

(54) BODY CONTROLLED DOUBLE CHANNEL TRANSISTOR AND CIRCUITS COMPRISING THE SAME

(75) Inventor: Frank Wirbeleit, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 120 days.

(21) Appl. No.: 12/956,291

(22) Filed: Nov. 30, 2010

(65) Prior Publication Data

US 2011/0080772 A1    Apr. 7, 2011

Related U.S. Application Data

(62) Division of application No. 12/144,281, filed on Jun. 23, 2008, now Pat. No. 7,880,239.

(30) Foreign Application Priority Data

Jan. 31, 2008   (DE) .......................... 10 2008 007 029

(51) Int. Cl.
   *H01L 27/118*    (2006.01)

(52) U.S. Cl.
   USPC ............ 257/203; 257/202; 257/204; 257/393

(58) Field of Classification Search
   USPC .......................... 257/200–400; 438/100–200
   See application file for complete search history.

(56) References Cited

U.S. PATENT DOCUMENTS

| | | | |
|---|---|---|---|
| 4,021,835 A | 5/1977 | Etoh et al. | 357/23 |
| 4,145,233 A * | 3/1979 | Sefick et al. | 438/289 |
| 4,276,095 A | 6/1981 | Beilstein, Jr. et al. | 148/1.5 |
| 4,350,991 A | 9/1982 | Johnson et al. | 357/23 |
| 4,819,043 A | 4/1989 | Yazawa et al. | 357/23.3 |
| 4,975,831 A | 12/1990 | Nilsson et al. | |
| 5,045,922 A | 9/1991 | Kodama et al. | 357/75 |
| 5,580,799 A | 12/1996 | Funaki | 438/289 |
| 5,610,533 A * | 3/1997 | Arimoto et al. | 326/33 |
| 5,663,589 A * | 9/1997 | Saitoh et al. | 257/401 |
| 5,672,536 A | 9/1997 | Wu et al. | 437/52 |
| 5,698,884 A | 12/1997 | Dennen | 257/345 |
| 5,751,813 A | 5/1998 | Dorenbos | |

(Continued)

FOREIGN PATENT DOCUMENTS

| | | |
|---|---|---|
| DE | 692 31 030 T2 | 12/1992 |
| DE | 102 45 575 A1 | 4/2004 |

(Continued)

OTHER PUBLICATIONS

Translation of Official Communication from German Patent Office for German Patent Application No. 10 2008 007 029.7 dated Nov. 6, 2008.

(Continued)

*Primary Examiner* — Lex Malsawma

*Assistant Examiner* — Eric Jones

(74) *Attorney, Agent, or Firm* — Williams, Morgan & Amerson, P.C.

(57) ABSTRACT

By providing a body controlled double channel transistor, increased functionality in combination with enhanced stability may be accomplished. For instance, flip flop circuits usable for static RAM cells may be formed on the basis of the body controlled double channel transistor, thereby reducing the number of transistors required per cell, which may result in increased information density.

12 Claims, 13 Drawing Sheets

(56) References Cited

U.S. PATENT DOCUMENTS

| | | | |
|---|---|---|---|
| 5,757,714 A * | 5/1998 | Choi et al. | 365/226 |
| 5,819,047 A | 10/1998 | Bauer et al. | |
| 5,838,606 A | 11/1998 | Blankenship et al. | |
| 5,900,665 A * | 5/1999 | Tobita | 257/357 |
| 6,073,172 A | 6/2000 | Frailong et al. | |
| 6,127,705 A | 10/2000 | Kim | |
| 6,189,101 B1 | 2/2001 | Dusenbury | |
| 6,192,034 B1 | 2/2001 | Hsieh et al. | |
| 6,219,786 B1 | 4/2001 | Cunningham et al. | |
| 6,245,607 B1 | 6/2001 | Tang et al. | 438/217 |
| 6,324,286 B1 | 11/2001 | Lai et al. | |
| 6,360,338 B1 | 3/2002 | Johnson et al. | |
| 6,363,411 B1 | 3/2002 | Dugan et al. | |
| 6,368,914 B1 * | 4/2002 | Kim et al. | 438/257 |
| 6,374,299 B1 | 4/2002 | Ford et al. | |
| 6,411,506 B1 | 6/2002 | Hipp et al. | |
| 6,424,523 B1 | 7/2002 | Curtis et al. | |
| 6,426,530 B1 | 7/2002 | Bertin | |
| 6,449,221 B1 | 9/2002 | Knight et al. | |
| 6,581,166 B1 | 6/2003 | Hirst et al. | |
| 6,594,150 B2 | 7/2003 | Creason et al. | |
| 6,640,278 B1 | 10/2003 | Nolan et al. | |
| 6,665,714 B1 | 12/2003 | Blumenau et al. | |
| 6,684,343 B1 | 1/2004 | Bouchier et al. | |
| 6,711,134 B1 | 3/2004 | Wichelman et al. | |
| 6,714,983 B1 | 3/2004 | Koenck et al. | |
| 6,778,002 B2 * | 8/2004 | Miyazaki et al. | 327/534 |
| 6,782,047 B1 | 8/2004 | Le et al. | |
| 6,784,496 B1 * | 8/2004 | Brodsky et al. | 257/355 |
| 6,807,169 B2 | 10/2004 | Mattathil | |
| 6,898,096 B2 | 5/2005 | Endo et al. | 363/147 |
| 6,944,019 B2 | 9/2005 | King et al. | |
| 6,948,090 B2 | 9/2005 | King | |
| 6,952,659 B2 | 10/2005 | King | |
| 7,005,350 B2 | 2/2006 | Walker et al. | 438/268 |
| 7,069,345 B2 | 6/2006 | Shteyn | |
| 7,168,092 B2 | 1/2007 | King | |
| 7,181,543 B2 | 2/2007 | King | |
| 7,225,239 B2 | 5/2007 | King | |
| 7,268,400 B2 * | 9/2007 | Cecchi et al. | 257/371 |
| 7,358,573 B2 * | 4/2008 | Cecchi et al. | 257/371 |
| 7,442,971 B2 | 10/2008 | Wirbeleit et al. | 257/287 |
| 7,592,832 B2 * | 9/2009 | Perisetty | 326/37 |
| 2002/0041003 A1 | 4/2002 | Udrea et al. | 257/502 |
| 2002/0044663 A1 | 4/2002 | King | |
| 2002/0062447 A1 | 5/2002 | King | |
| 2002/0124128 A1 | 9/2002 | Qiu | |
| 2002/0163021 A1 | 11/2002 | Robb et al. | 257/273 |
| 2002/0179946 A1 | 12/2002 | Hara et al. | 257/288 |
| 2003/0048657 A1 | 3/2003 | Forbes | 365/154 |
| 2003/0051057 A1 | 3/2003 | Garnett et al. | |
| 2003/0051166 A1 | 3/2003 | Garnett et al. | |
| 2003/0051168 A1 | 3/2003 | King et al. | |
| 2003/0105859 A1 | 6/2003 | Garnett et al. | |
| 2003/0220924 A1 | 11/2003 | Bourbonnais | |
| 2003/0233541 A1 | 12/2003 | Fowler et al. | |
| 2004/0145399 A1 | 7/2004 | Bhattacharyya | 327/278 |
| 2005/0288918 A1 | 12/2005 | Chen et al. | |
| 2006/0022282 A1 | 2/2006 | Wirbeleit et al. | 257/403 |
| 2006/0187724 A1 * | 8/2006 | Pineda De Gyvez et al. | 365/201 |
| 2007/0120198 A1 * | 5/2007 | Chen et al. | 257/372 |
| 2007/0176246 A1 | 8/2007 | Wirbeleit et al. | 257/404 |
| 2009/0194824 A1 * | 8/2009 | Wirbeleit | 257/393 |
| 2011/0080772 A1 * | 4/2011 | Wirbeleit | 365/154 |

FOREIGN PATENT DOCUMENTS

| | | |
|---|---|---|
| DE | 102 52 882 A1 | 6/2004 |
| DE | 102004037087 A1 | 3/2006 |
| DE | 102006004409 A1 | 8/2007 |
| EP | 0 774 785 A2 | 5/1997 |

OTHER PUBLICATIONS

PCT Search Report and Written Opinion from PCT/US2009/000602 dated May 25, 2009.
Office Action dated Dec. 1, 2006 from related U.S. Appl. No. 11/045,177.
Office Action dated May 18, 2007 from related U.S. Appl. No. 11/045,177.
Office Action dated Aug. 28, 2007 from related U.S. Appl. No. 11/045,177.
Office Action dated Feb. 26, 2008 from related U.S. Appl. No. 11/045,177.
Notice of Allowance dated Aug. 14, 2008 from related U.S. Appl. No. 11/045,177.
Office Action dated Nov. 23, 2009 from related U.S. Appl. No. 12/240,312.
Final Office Action dated May 25, 2010 from related U.S. Appl. No. 12/240,312.
Translation of German Patent Document DE10245575A1.

* cited by examiner

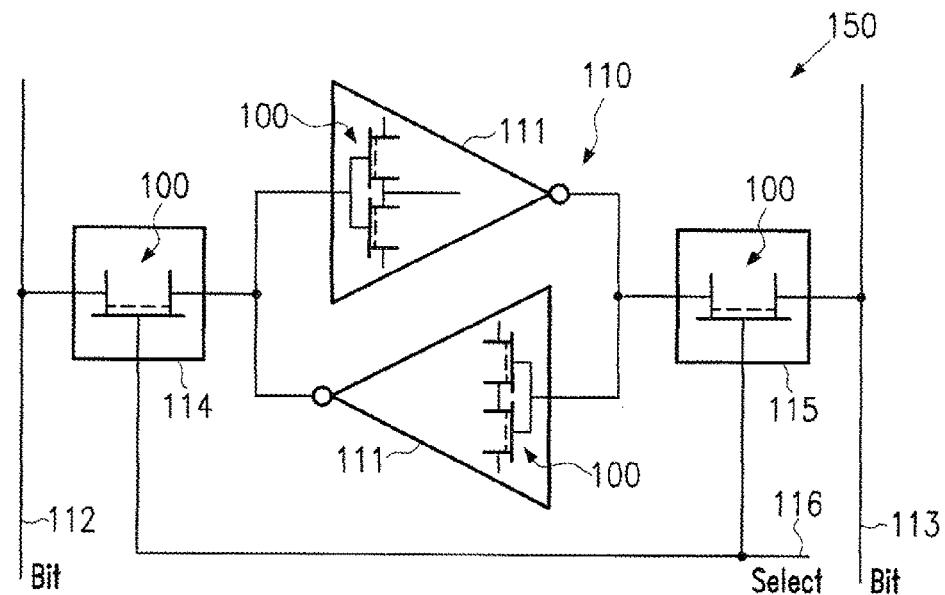
Fig.1d
(prior art)
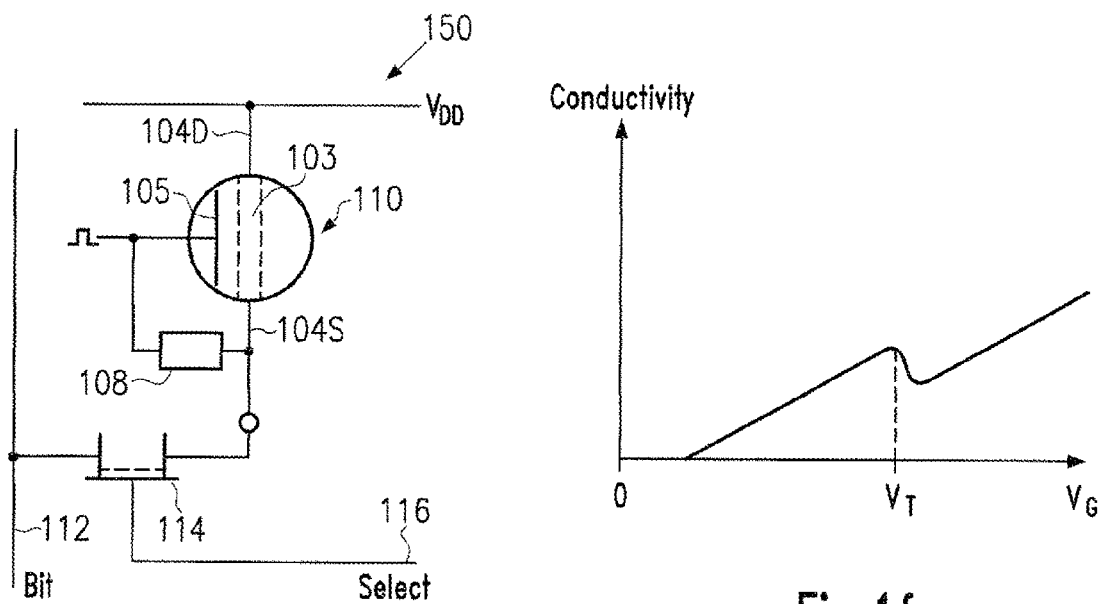
Fig.1e
(prior art)
Fig.1f
(prior art)

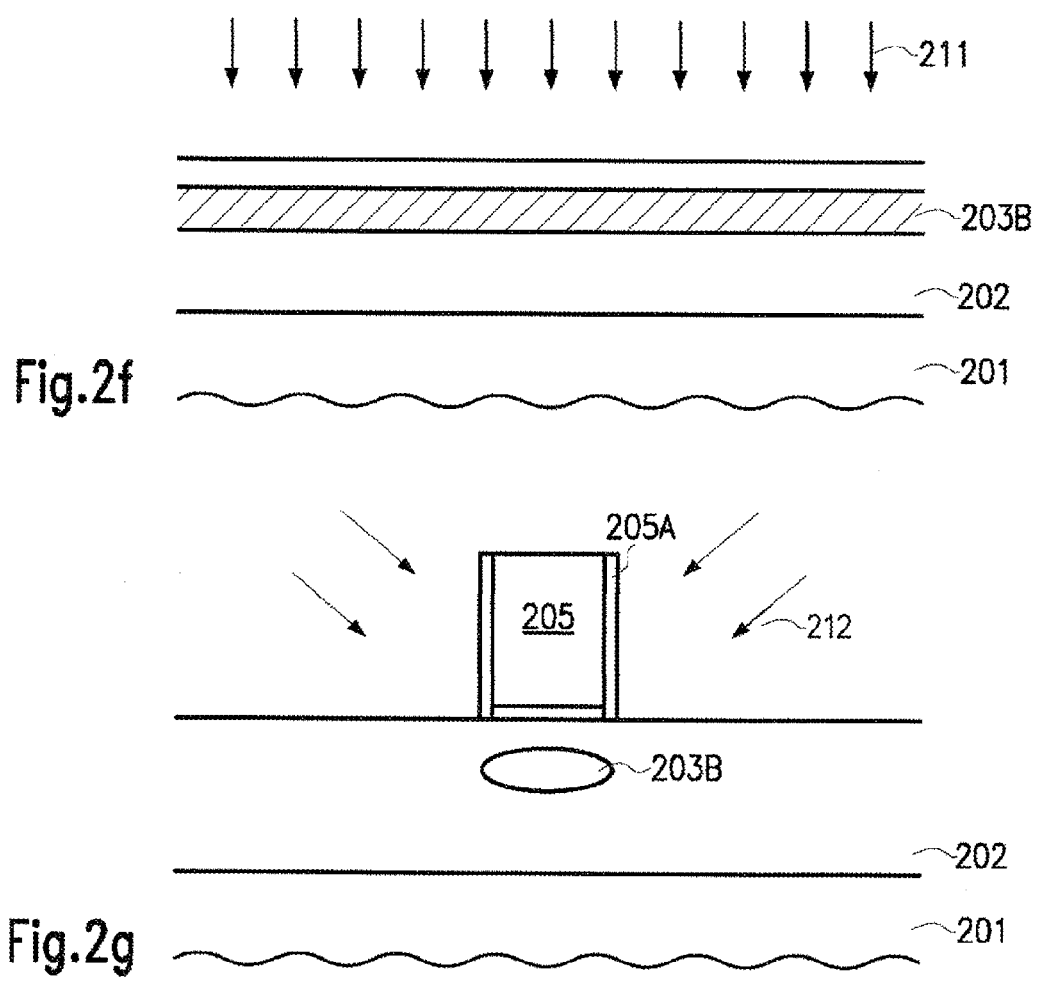

BODY CONTROLLED DOUBLE CHANNEL TRANSISTOR AND CIRCUITS COMPRISING THE SAME

CROSS-REFERENCE TO RELATED APPLICATION

This is a divisional of co-pending application Ser. No. 12/144,281, filed Jun. 23, 2008.

BACKGROUND OF THE INVENTION

1. Field of the Invention

The present disclosure generally relates to the fabrication of integrated circuits, and, more particularly, to transistor architectures that enable an extended functionality of transistor devices, thereby providing the potential for simplifying the configuration of circuit elements, such as registers, static RAM cells and the like.

2. Description of the Related Art

In modern integrated circuits, such as microprocessors, storage devices and the like, a great number of circuit elements, especially transistors, are provided and operated on a restricted chip area. Although immense progress has been made over the recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. However, the continuing scaling of feature sizes involves great efforts in redesigning process techniques and developing new process strategies and tools to comply with new design rules. Generally, in complex circuitry including complex logic portions, MOS technology is presently a preferred manufacturing technique in view of device performance and/or power consumption and/or cost efficiency. In integrated circuits including logic portions formed by MOS technology, a large number of field effect transistors (FETs) are provided that are typically operated in a switched mode, that is, these devices exhibit a highly conductive state (on-state) and a high impedance state (off-state). The state of the field effect transistor is controlled by a gate electrode, which may influence, upon application of an appropriate control voltage, the conductivity of a channel region formed between a drain terminal and a source terminal.

FIG. 1a schematically shows a cross-sectional view of a typical field effect transistor element as may be used in modern MOS-based logic circuitry. A transistor element 100 comprises a substrate 101, for instance a silicon substrate, having formed thereon or therein a crystalline region 102 on and in which further components of the transistor element 100 are formed. The substrate 101 may also represent an insulating substrate having formed thereon a crystalline semiconductor layer of specified thickness that accommodates further components of the transistor 100. The crystalline region 102 comprises two or more different dopant materials in a varying concentration so as to obtain the desired transistor function. To this end, highly doped drain and source regions 104 defining a first conductivity type, for instance, an N-conductivity, are formed within the crystalline region 102 and have a specified lateral and vertical dopant profile. On the other hand, the crystalline region 102 between the drain and source regions 104 may be doped with a material providing the opposite conductivity type, that is, in the example shown, a P-conductivity, so as to produce a PN junction with each of the drain and source regions 104. Moreover, a relatively thin channel region 103 may be established between the drain and source regions 104 and it may be doped with a P-type material when the transistor 100 is to represent an N-channel enhancement transistor, or which may be slightly doped with an N-type material when the transistor 100 is to represent an N-channel depletion transistor. Formed above the channel region 103 is a gate electrode 105, which is separated and thus electrically insulated from the channel region 103 by a thin gate insulation layer 106. In a typical modern transistor element, sidewall spacers 107 may be provided at sidewalls of the gate electrode 105, which may be used during the formation of the drain and source regions 104 by ion implantation and/or in subsequent processes for enhancing the conductivity of the gate electrode 105, which is typically comprised of doped polysilicon in silicon-based transistor elements. For convenience, any further components such as metal silicides and the like are not shown in FIG. 1a.

As previously mentioned, an appropriate manufacturing process involves a plurality of highly complex process techniques which depend on the specified design rules that prescribe the critical dimensions of the transistor element 100 and respective process margins. For example, one essential dimension of the transistor 100 is the channel length, i.e., in FIG. 1a, the horizontal extension of the channel region 103, wherein the channel length is substantially determined by the dimension of the gate electrode 105 since the gate electrode 105, possibly in combination with any sidewall spacers, such as the spacers 107, is used as an implantation mask during the formation of the drain and source regions 104. As critical dimensions of advanced transistor elements are presently at approximately 50 nm and even less, any further progress in enhancing performance of integrated circuits entails great effort in adapting established process techniques and in developing new process techniques and process tools. Irrespective of the actual dimensions of the transistor element 100, the basic operations scheme is as follows. During operation, the drain and source regions 104 are connected to respective voltages, such as ground and supply voltage $V_{DD}$, wherein it is now assumed that the channel region 103 is slightly P-doped so as to provide the functionality of an N-channel enhancement transistor. It is further assumed that the left region 104 is connected to ground and will thus be referred to as the source region, even though, in principle, the transistor architecture shown in FIG. 1a is symmetric with respect to the regions 104. Hence, the region 104 on the right-hand side, connected to $V_{DD}$, will be referred to as the drain region. Moreover, the crystalline region 102 is also connected to a specified potential, which may be ground potential, and any voltages referred to in the following are considered as voltages with respect to the ground potential supplied to the crystalline region 102 and the source region 104. Without a voltage supplied to the gate electrode 105 or with a negative voltage, the conductivity of the channel region 103 remains extremely low, since at least the PN junction from the channel region 103 to the drain region 104 is inversely biased and only a negligible number of minority charge carriers is present in the channel region 103. Upon increasing the voltage supplied to the gate electrode 105, the number of minority charge carriers, i.e., electrons, in the channel region 103 may be increased due to the capacitive coupling of the gate potential to the channel region 102, but without significantly increasing the total conductivity of the channel region 103, as the PN junction is still not sufficiently forward-biased. Upon further increasing the gate voltage, the channel conductivity abruptly increases, as the number of minority charge carriers is increased to remove the space charge area in the PN junction, thereby forward-biasing the PN junction so that electrons may flow from the source region to the drain region. The gate voltage at which the abrupt conductivity change of the channel region 103 occurs is referred to as threshold voltage $V_T$.

FIG. 1b qualitatively illustrates the behavior of the device 100 when representing an N-channel enhancement transistor. The gate voltage $V_G$ is plotted on the horizontal axis $V_T$, while the vertical axis represents the current, that is the electrons, flowing from the source region to the drain region via the channel region 103. It should be appreciated that the drain current depends on the applied voltage $V_{DD}$ and the specifics of the transistor 100. At any rate, the drain current may represent the behavior of the channel conductivity, which may be controlled by gate voltage $V_G$. In particular, a high impedance state and a high conductivity state are defined by the threshold voltage $V_T$.

FIG. 1c schematically shows the behavior of the transistor element 100 when provided in the form of an N-channel depletion transistor, i.e., when the channel region 103 is slightly N-doped. In this case, the majority charge carriers (electrons) provide conductivity of the channel region 103 for a zero gate voltage, and even for a negative gate voltage, unless the negative gate voltage is sufficiently high so as to create sufficient minority charge carriers to establish an inversely biased PN junction, thereby abruptly decreasing the channel conductivity. The threshold voltage $V_T$ is shifted to negative gate voltages in the N-channel depletion transistor when compared with the behavior of the N-channel enhancement transistor.

It should be noted that a similar behavior is obtained for P-channel enhancement and depletion transistors, wherein, however, the channel conductivity is high for negative gate voltages and abruptly decreases at the respective threshold voltages with a further increasing gate voltage.

On the basis of field effect transistors, such as the transistor element 100, more complex circuit components may be created. For instance, storage elements in the form of registers, static RAM (random access memory) and dynamic RAM represent an important component of complex logic circuitries. For example, during the operation of complex CPU cores, a large amount of data has to be temporarily stored and retrieved, wherein the operating speed and the capacity of the storage elements significantly influence the overall performance of the CPU. Depending on the memory hierarchy used in a complex integrated circuit, different types of memory elements are used. For instance, registers and static RAM cells are typically used in the CPU core due to their superior access time, while dynamic RAM elements are preferably used as working memory due to the increased bit density compared to registers or static RAM cells. Typically, a dynamic RAM cell comprises a storage capacitor and a single transistor, wherein, however, a complex memory management system is required to periodically refresh the charge stored in the storage capacitors, which may otherwise be lost due to unavoidable leakage currents. Although the bit density of DRAM devices may be very high, a charge has to be transferred from and to storage capacitors in combination with periodic refresh pulses, thereby rendering these devices less efficient in terms of speed and power consumption when compared to static RAM cells. On the other hand, static RAM cells require a plurality of transistor elements to allow the storage of an information bit.

FIG. 1d schematically shows a sketch of a static RAM cell 150 in a configuration as may typically be used in modern integrated circuits. The cell 150 comprises a bit cell 110 including, for instance, two inversely coupled inverters 111. The bit cell 110 may be connectable to a bit line 112 and to an inverse bit line 113 by respective select transistor elements 114, 115. The bit cell 110, that is, the inverters 111, as well as the select transistor elements 114, 115 may be formed of transistor elements, such as the transistor 100 shown in FIG. 1a. For example, the inverters 111 may each comprise a complementary pair of transistors 100, that is, one P-channel enhancement transistor and one N-channel enhancement transistor coupled as shown in FIG. 1d. Likewise, the select transistor elements 114, 115 may be comprised of N-channel enhancement transistors 100.

During operation of the RAM cell 150, the bit cell 110 may be "programmed" by pre-charging the bit lines 112, 113, for example, with logic high and logic zero, respectively, and by activating the select line 116, thereby connecting the bit cell 110 with the bit lines 112, 113. After deactivating the select line 116, the state of the bit cell 110 is maintained as long as the supply voltage is connected to the cell 150 or as long as a new write cycle is performed. The state of the bit cell 110 may be retrieved by, for example, bringing the bit lines 112, 113 in a high impedance state and activating the select line 116.

As is evident from FIG. 1d, high operating speeds are achievable with the cell 150 due to the absence of storage capacitors, and a simplified management in reading and writing the bit cell 110 is provided since any synchronization with refresh pulses is not necessary. On the other hand, at least six individual transistor elements 100 are required for storing an information bit, thereby rendering the architecture of the cell 150 less space efficient. Hence, frequently, a trade-off has to be made with respect to bit density in relation to speed and performance requirements.

In order to reduce the number of transistor elements in static RAM cells, it has, therefore, been proposed to use switching elements with increased functionality compared to conventional field effect transistors, as will be explained with reference to FIGS. 1e and 1f.

FIG. 1e schematically shows a circuit diagram of a basic static RAM cell 150 comprising a bit cell 110 for storing an information bit. The bit cell 110 is coupled to a select transistor 114, which in turn is connected to a bit line 112 and a select line 116. The bit cell 110 is comprised of a semiconductor element having an increased functionality compared to a conventional transistor and including a channel region 103 that is configured to provide a controllable conductivity, wherein a gate electrode 105 is provided, which enables the control of the channel region 103 via capacitive coupling. Moreover, a feedback section 108 is provided, for instance, in the form of an electrically conductive region having a specified resistivity or the like to connect the channel region 103 via an output terminal 104S with the gate electrode 105. Furthermore, the channel region 103 may be connected to a specified voltage source, such as the source supplying the supply voltage $V_{DD}$, by a respective output terminal 104D. The bit cell 110 is configured such that, upon application of a specified control voltage to the gate electrode 105, the conductivity of the channel region 103 changes from a moderately high impedance state into a state of moderately high conductivity, which may be maintained, even after interrupting the initial control voltage, via the feedback section 108. To this end, the semiconductor device 110 exhibits a specified behavior with respect to the conductivity of the channel region 103 in relation to the applied control voltage $V_G$ once the device 110 is in the conductive state, as will be explained with reference to FIG. 1f.

FIG. 1f qualitatively describes the behavior of the bit cell 110 that is obtained by the above-described configuration. In FIG. 1f, the conductivity of the channel 103 is plotted along the vertical axis in arbitrary units and the control voltage $V_G$ supplied to the gate electrode 105 is shown on the horizontal axis. The semiconductor device 110 is configured such that at a specified threshold voltage $V_T$, which may be set by structural measures, such as providing a second channel region, exhibits, as will be described in more detail, the conductivity of the channel 103 a more or less pronounced change or a local maximum in such a way that, with a further increase of the control voltage $V_G$ at the gate electrode 105, a drop in conductivity is obtained. In the further description it is assumed that the voltage $V_{DD}$ is higher than the threshold voltage $V_T$. Hence, after application of an initial control voltage in excess of the threshold voltage $V_T$, the channel region 103 is in a highly conductive state so that the supply voltage $V_{DD}$ is more or less also present at the output 104S and, via the feedback section 108, at the gate electrode 105. Thus, even after discontinuing an initial control voltage, a corresponding voltage is supplied via the conductive channel 103, the feedback section 108 to the gate electrode 105, wherein ideally a self-stabilizing condition should be established, since the channel conductivity increases as the voltage at the gate electrode 105 tends to decrease during discontinuing the initially supplied control voltage pulse owing to, for example, charge carrier leakage and the like. Consequently, due to the abrupt increase of the conductivity with decreasing voltage at the gate electrode 105 at $V_T$, the voltage drop across the channel 103 is reduced and charge, required at the gate electrode 105 for maintaining the conductivity of the channel 103, is increasingly replaced, thereby maintaining the control voltage $V_G$ above or at the threshold voltage $V_T$. As a result, a more or less stationary conductive state of the channel region 103 may be achieved and may be maintained as long as the supply voltage $V_{DD}$ is provided.

Again referring to FIG. 1e, during operation of the static RAM cell 150, the bit cell 110 may be written to by pre-charging the bit line 112 with a voltage above or at the threshold voltage $V_T$, for instance $V_{DD}$, and by activating the select line 116, thereby switching the select transistor 114 from its off-state into its on-state. When the select transistor 114 is in its on-state, the voltage at the bit line 112 is supplied via the feedback section 108 to the gate electrode 105, which is correspondingly charged to generate a conductivity of the channel region 103, as is qualitatively shown in FIG. 1f, at or above the threshold voltage $V_T$. Thereafter, the select transistor 114 may be disabled and the bit line 112 may be brought into a high impedance state so that it is prepared for a read operation. Due to the "self-biasing" mechanism of the bit cell 110, the conductivity of the channel region 103 is maintained at a moderately high value, even though the initial control voltage pulse supplied via the select transistor 114 is discontinued. As previously explained, this low impedance state of the bit cell 110 may be stationary, depending on the stability of the device 110 including a transistor with a double channel configuration, and may remain as long as the supply voltage $V_{DD}$ is present or a new write cycle is initiated.

During reading of the bit cell 110, the bit line 112 may be in a high impedance state and the select transistor 114 may be switched into its on-state by activating the select line 116. Due to the self-biased high conductivity state of the bit cell 110, charge may be supplied from the supply voltage source $V_{DD}$ to the bit line 112 to establish the voltage $V_{DD}$ at the bit line 112, which may be sensed by a corresponding sense amplifier (not shown). Thus, a logic state corresponding to the self-biased state of the bit cell 110 may be identified and read out. Similarly, a high impedance state may be written into the bit cell 110 by, for instance, pre-charging the bit line 112 with ground potential and activating the select line 116. In this case, the ground potential is supplied to the gate 105 via the feedback section 108. The inherent resistance of the bit line 112 is assumed to be significantly lower than the resistance of the channel region 103 in its high conductivity state, and hence the channel region 103 is brought into its high impedance state, which is maintained even if the bit line 112 is decoupled from the output 104S by deactivating the select line 116.

Although the semiconductor bit cell 110 may, in principle, provide a significantly simplified architecture for a static RAM cell, the data integrity relies on the stability of the operational behavior of the semiconductor device 110, that is, a double channel transistor, as will be explained later on. However, the local maximum of the transfer slope (see FIG. 1f) may not be as pronounced as desired for obtaining a stable operation of the semiconductor bit cell 110 on the basis of conventional double channel transistors.

The present disclosure is directed to various devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to transistor devices having increased functionality compared to conventional field effect transistors, wherein a doped region may be provided within the body region of a transistor, thereby modifying the trans-conductance of the transistor to generate a local extreme value, such as a maximum. Furthermore, the desired local maximum may be significantly pronounced by providing a body contact that is configured to enable an individual control of the body potential by applying an appropriate control signal. Consequently, by appropriately controlling the body region by means of the body contact or terminal, a significant enhancement of the locally occurring maximum in the transfer slope may be achieved, which directly translates into enhanced operational stability. Using the concept of a body controlled transistor having formed therein a doped region of the same conductivity type as the drain and source region, wherein such a configuration will be referred to herein as a double channel transistor, enables the creation of electronic circuits, such as flip flops and the like, with a reduced number of individual transistor components, thereby enhancing functionality and/or packing density in sophisticated semiconductor devices. Thus, in some illustrative aspects disclosed herein, static memory cells may be formed with a significantly enhanced information density.

One illustrative semiconductor device disclosed herein comprises a field effect transistor. The field effect transistor comprises a drain region and a source region having a first conductivity type, and a body region formed at least between the drain and source regions, which has a second conductivity type other than the first conductivity type. Furthermore, the semiconductor device comprises a gate electrode formed above a channel region of the body region, wherein the gate electrode is separated from the channel region by an insulation layer. Moreover, a doped region is located between the drain and source regions and has the first conductivity type. Finally, the semiconductor device comprises a body terminal connected to the body region and the body terminal is configured to receive a variable control voltage.

One illustrative electronic circuit disclosed herein comprises a field effect transistor. The field effect transistor comprises a drain region and a source region having a first conductivity type and a body region formed at least between the drain and source regions, wherein the body region has a second conductivity type other than the first conductivity type.

Additionally, a gate electrode is formed above a channel region of the body region and is separated from the channel region by an insulation layer. A doped region is located between the drain and source regions and has a first conductivity type. Furthermore, the field effect transistor comprises a body terminal connected to the body region and configured to receive a variable control voltage. Additionally, the electronic circuit comprises a circuit element connected to the field effect transistor and a signal input terminal and/or a signal output terminal that is connected to the body terminal.

One illustrative static RAM cell disclosed herein comprises a select transistor configured to receive at least one of a read signal and a write signal. The static RAM cell further comprises a first field effect transistor comprising a first body region connected to the select transistor to enable selective application of at least one of a read signal and a write signal to the first body region.

BRIEF DESCRIPTION OF THE DRAWINGS

The disclosure may be understood by reference to the following description taken in conjunction with the accompanying drawings, in which like reference numerals identify like elements, and in which:

FIG. 1d schematically shows a circuit diagram of a typical conventional static RAM cell including at least six individual transistor elements;

FIG. 1e schematically shows a circuit diagram of a storage element including a self-biasing semiconductor device;

FIG. 1f schematically shows a qualitative plot of the progression of a channel conductivity versus an applied control voltage to obtain a self-biased stationary conductivity state;

FIGS. 2f and 2g schematically illustrate cross-sectional views of a transistor element during various manufacturing stages in forming an isolated doped region between drain and source regions having the same conductivity type, according to illustrative embodiments;

Figure 1A:
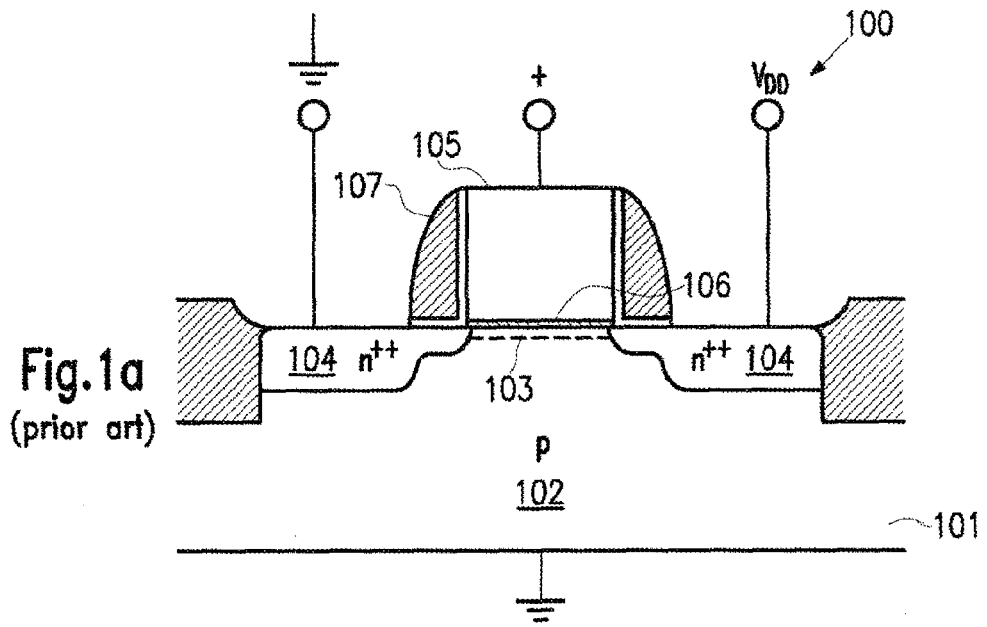
FIG. 1a schematically shows a cross-sectional view of a typical conventional field effect transistor.
Figure 1B:
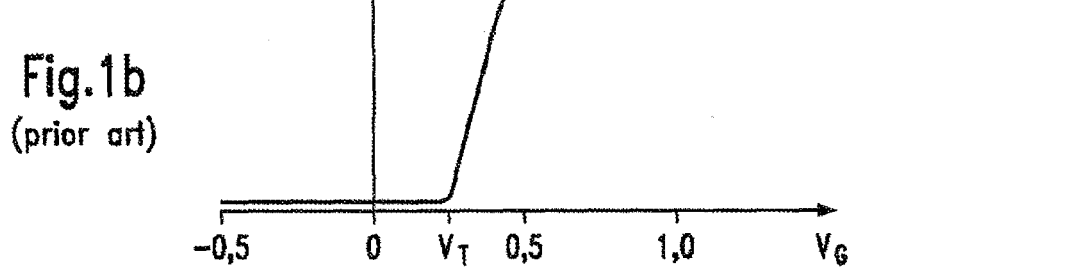
FIGS. 1b and 1c schematically show plots of the progression of the drain current, i.e., the progression of the channel conductivity, versus the applied gate voltage for an N-channel enhancement transistor and for an N-channel depletion transistor, respectively.
Figure 1C:
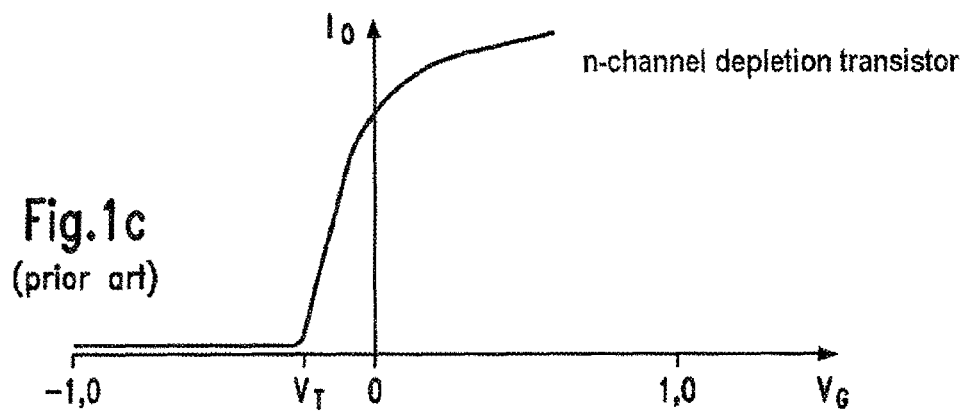

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to semiconductor devices and respective techniques for enhancing the circuit architecture of a plurality of circuit types, such as logic circuits, oscillators and the like, and enables, in particular, a space-efficient configuration of registers, static memory cells and other circuits. For this purpose, the characteristics of a field effect transistor may be modified to obtain extended functionality, which may be accomplished by modifying the body region so as to obtain an additional doped area, wherein the response of the modified channel region and thus of the transistor element as a whole may be controlled on the basis of an additional body contact. It has been recognized that a significant enhancement of device stability of a double channel transistor may be accomplished by appropriately using the body region as a control input, thereby obtaining a pronounced local extreme value, such as a maximum, in the transistor transfer slope, which may thus be used for a plurality of electronic circuits to impart enhanced or extended functionality compared to conventional circuits of the same type and/or for enabling a more space-efficient integration of respective electronic circuits, for instance, in the form of multi-state logic elements, flip flops, which may be used as static RAM components, and the like.

According to the principles disclosed herein, the functional behavior of the transistor elements may be considered a mixture of a P-channel-like behavior and an N-channel-like behavior, thereby obtaining a desired local maximum in the transfer slope, which may therefore be advantageously used for extending the functionality of electronic circuits. The transition between the P-channel-like behavior and the N-channel-like behavior may be achieved in a stable and reproducible manner by using the body region of the double channel transistor as an efficient control input.

Figure 2A:
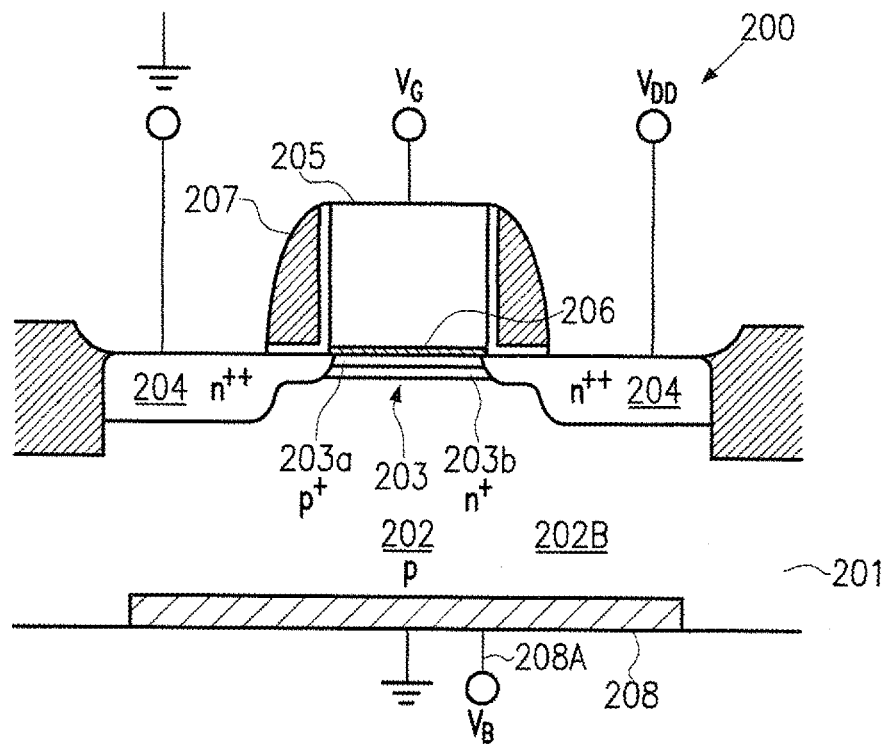
FIGS. 2a and 2b schematically show cross-sectional views of transistor elements, each having two inversely doped channel regions for an N-type double channel transistor and a P-type double channel transistor, respectively, according to illustrative embodiments disclosed herein.

FIG. 2a schematically shows a cross-sectional view of a transistor element 200 that may be used in forming a self-biasing circuit, such as the self-biasing bit cell 110 in FIG. 1e. The transistor element 200 comprises a substrate 201, which may be any appropriate substrate, such as a bulk semiconductor substrate, an insulating substrate having formed thereon a crystalline semiconductor layer and the like. In particular embodiments, the substrate 201 may represent a bulk silicon substrate or a silicon-on-insulator (SOI) substrate, since presently, and in the near future, the vast majority of complex integrated circuits will be fabricated on the basis of silicon. It should be appreciated, however, that the principles disclosed herein may also be realized on the basis of other semiconductor materials, such as gallium arsenide, germanium and the like. Formed on the substrate 201 is a substantially crystalline semiconductor region 202, which may comprise a specified dopant material to provide a specified conductivity type of the region 202. In the embodiment shown in FIG. 2a, the semiconductor region 202 is doped to provide a P-conductivity. Adjacent to the region 202 are formed drain and source regions 204 including a dopant material that imparts an opposite conductivity type to the semiconductor region 202. In the present case, the drain and source regions 204 are heavily doped so that corresponding PN junctions are formed along interfaces between the drain and source regions 204 and the semiconductor region 202. Moreover, a channel region 203 is formed between the drain and source regions 204.

In one illustrative particular embodiment, the channel region 203 may comprise a first channel sub-region 203A that is inversely doped with respect to the drain and source regions 204. Thus, the first channel sub-region 203A may be considered as a "conventional" channel region of a conventional enhancement transistor, such as, for instance, the transistor 100 in FIG. 1a. Additionally, in this embodiment, the channel region 203 may further comprise a second channel sub-region 203B that is inversely doped to the first channel sub-region 203A, and may therefore be considered as a "depletion" channel. Since the transistor device 200 of FIG. 2a represents an N-type transistor, the first channel sub-region 203A is P-doped and the second channel sub-region 203B is N-doped. The transistor element 200 further comprises a gate electrode 205 located so as to enable the control of the first and second channel sub-regions 203A and 203B by capacitive coupling. In the embodiment shown, the gate electrode 205 is separated from the channel region 203 by a gate insulation layer 206 comprised of silicon dioxide and/or silicon nitride and/or silicon oxynitride and/or high-k dielectric materials and the like. Moreover, the transistor element 200, which may be referred to herein as a double channel transistor due to the configuration of the channel region 203, may comprise sidewall spacers 207 formed on sidewalls of the gate electrode 205. It should be appreciated that further components, such as metal silicides, in case the gate electrode 205 and the drain and source regions 204 are substantially comprised of silicon, are not illustrated but may be provided in accordance with design requirements. Furthermore, it is to be noted that other transistor configurations, for instance including raised drain and source regions, finFET elements and the like, may also be employed with the present invention. Moreover, any contact portions that typically provide an electrical connection to the drain and source regions 204 and the gate electrode 205 are not shown. In some illustrative embodiments, a connection may be provided that connects one of the drain and source regions 204 with the gate electrode 205. A corresponding connection may be established in the form of a so-called local interconnect or may be established in one of the metallization levels formed above the device level. In other cases, the respective gate and drain and source terminals may be individually accessible.

The transistor 200 may further comprise a contact area 208 connecting to a portion of the semiconductor region 202 not corresponding to the drain and source regions 204 and the channel region 203. Typically, this part of the semiconductor region 202 may be referred to as the body or bulk region and is indicated as 202B. Consequently, the contact area 208 may be electrically connected to the body region 202B, while it may be electrically isolated, at least for specific electrical configurations, from the drain and source regions 204 and the channel region 203 by respective PN junctions. The contact area 208 may be appropriately connected to a contact structure 208A, which in FIG. 2a is only illustrated in a schematic form, wherein any appropriate circuit arrangement may be used, as may also be described in more detail later on. Consequently, by means of the contact structure 208A, the contact area 208 may be connected to a variable control voltage, as will be discussed later on in more detail. It should be appreciated that, depending on the overall configuration of the substrate 201, the contact area 208 may be connected to a plurality of body regions of transistors when a common application of a variable control voltage is considered appropriate. In other illustrative embodiments, a respective variable control voltage may be individually applied to transistor elements as required by the circuit function under consideration.

Figure 2B:
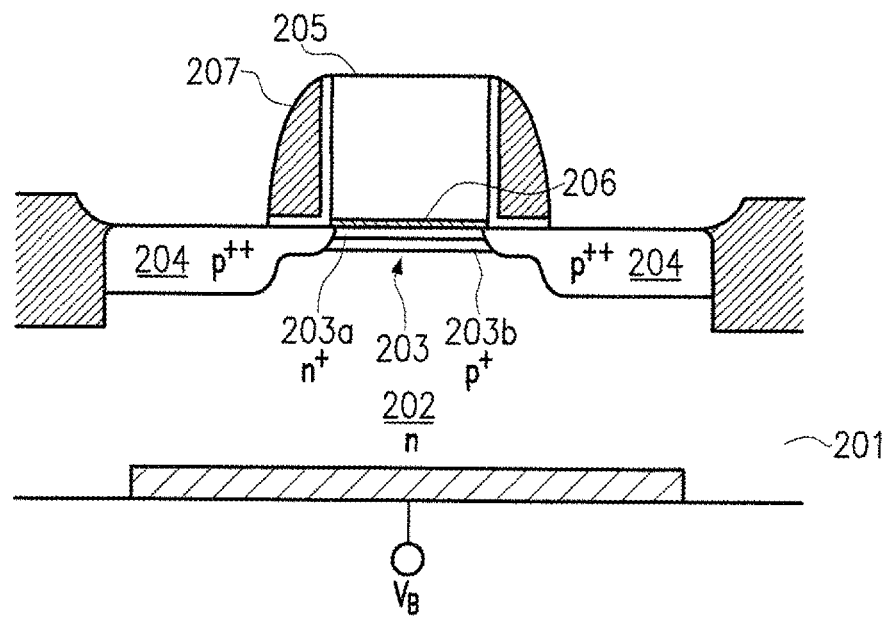

FIG. 2b schematically shows the transistor element 200 when configured as a P-type transistor. Hence, the transistor element 200 of FIG. 2b comprises the same components as previously described with reference to FIG. 2a with the exception that the drain and source regions 204, the channel sub-regions 203A and 203B, and the semiconductor region 202 and thus the body region 202B are inversely doped compared to the device of FIG. 2a.

A typical process flow for forming the semiconductor device 200 as shown in FIG. 2a or FIG. 2b may comprise the following processes. After the formation of any isolation structures (not shown) to define the overall dimensions of the transistor 200 and to provide electrical insulation to neighboring circuit elements, the vertical dopant profile of the semi-conductor region 202 may be created by well-established ion implantation cycles. During this ion implantation sequence, the vertical dopant profile of the channel region 203 may also be established. For example, after doping the semiconductor region 202 with a P-type material by ion implantation and/or by providing a pre-doped substrate or by forming an epitaxially grown semiconductor layer in a deposition atmosphere including a dopant, an N-doped region corresponding to the second channel sub-region 203B (FIG. 2a) may be created. For this purpose, a surface portion of the semiconductor region 202 may be pre-amorphized so as to reduce any channeling effects during the ion implantation of the N-type dopant material for defining the second channel sub-region 203B. Thereafter, a further ion implantation sequence may be performed to create the P-doped first channel sub-region 203A, wherein, in both implantation cycles, the dose and implantation energy may be appropriately selected so as to achieve a desired concentration and a specified depth within the semiconductor region 202. Corresponding process parameters may readily be obtained by performing simulation calculations and/or test runs. In other embodiments, one or two semi-conductor layers may be epitaxially grown in a deposition atmosphere containing the required type of dopant. For instance, an N-type semiconductor layer may be grown on the semiconductor region 202, followed by the epitaxial growth of a P-type semiconductor layer with a desired thickness. Similarly, the semiconductor region 202 may be implanted so as to create the second channel sub-region 203B and subsequently a layer for the first channel sub-region 203A may be formed by epitaxial growth in a dopant-containing atmosphere. Moreover, after forming the channel region 203, additional threshold voltage implantations may be performed to correspondingly adjust the finally obtained thresholds for the controllability of the channel region 203 by means of the gate electrode 205. Thereafter, the gate insulation layer 206 and the gate electrode 205 may be formed in conformity with conventionally established processes, followed by advanced implantation cycles for forming the drain and source regions 204. Afterwards, further processes, including anneal cycles for activating dopants and re-crystallizing amorphized or damaged crystalline portions in the drain and source regions 204, the semiconductor region 202 and the channel region 203, followed by other processes such as silicidation and the like, may be performed in accordance with well-established process techniques.

Figure 2C:
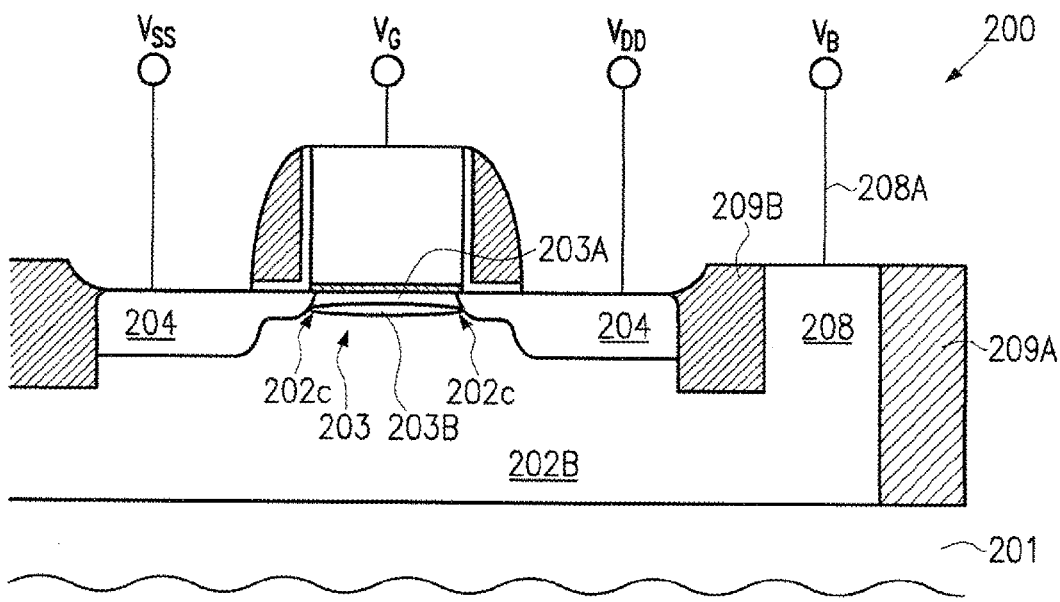
FIGS. 2c and 2d schematically illustrate cross-sectional views of double channel transistor elements in which the second "channel" region may be substantially separated from drain and source regions, according to still other illustrative embodiments.

FIG. 2c schematically illustrates a cross-sectional view of the semiconductor device 200 according to further illustrative embodiments in which the channel region 203 may comprise the first sub-channel 203A in a similar configuration as previously described. Furthermore, the second sub-channel 203B, which may also be referred to as a doped region within the body region 202B, may be substantially separated from the drain and source regions 204. That is, the body region 202 having a P-type conductivity for an N-channel transistor may directly connect to the channel sub-region 203A due to respective portions 202 having a conductivity type corresponding to the body region 202B and the channel sub-region 203A. That is, the doped region or second sub-channel 203B may be considered as an island positioned between the drain and source regions 204. Furthermore, in the embodiment shown, the contact area 208 may be provided laterally adjacent to one of the drain and source regions 204, wherein an isolation structure 209B may be provided to separate the drain and source regions 204 and the contact area 208. In other illustrative embodiments, the isolation structure 209B may be omitted such that a respective PN junction may separate the drain or source region 204 from the contact area 208. In some illustrative embodiments, a further isolation structure 209A may be provided to isolate the transistor 200 including the laterally adjacent contact area 208 from other circuit elements. Consequently, in this arrangement, the contact structure 208A may be formed in a common manufacturing sequence with a contact structure connecting to the drain and source regions 204 and the gate electrode 205. It should be appreciated that the transistor 200 of FIG. 2c may represent a bulk transistor configuration or an SOI configuration, wherein a buried insulating layer may be positioned below the body region 202B.

Figure 2D:
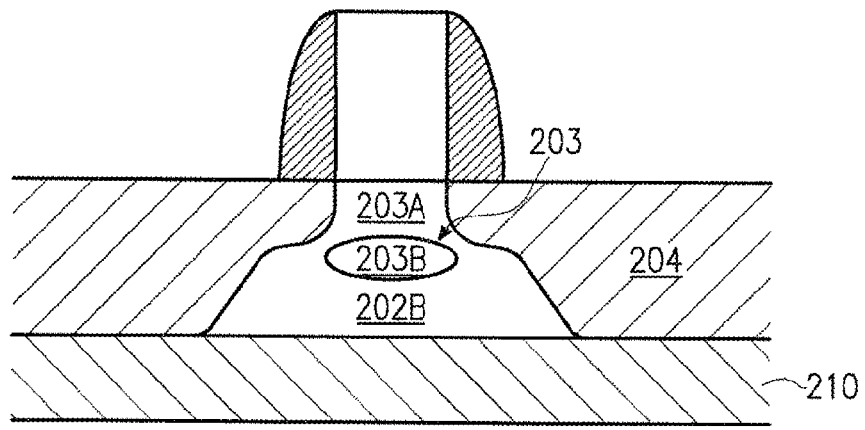

FIG. 2d schematically illustrates the transistor 200 according to further illustrative embodiments representing an SOI configuration including a buried insulating layer 210. Furthermore, the channel sub-region 203B or doped region may also be provided as an isolated area, as previously explained.

Figure 2E:
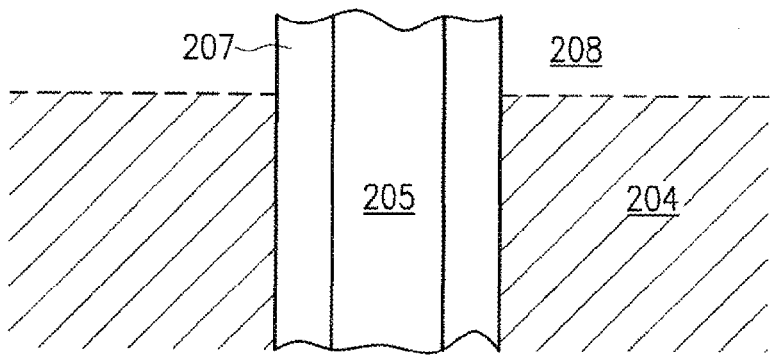
FIG. 2e schematically illustrates a top view of a double channel transistor in an SOI configuration including a body contact connecting to a body of the double channel transistor, according to illustrative embodiments.

FIG. 2e schematically illustrates the device 200 in a top view, wherein the contact area 208 is formed adjacent to the drain and source regions 204, or at least one of these regions, without providing an isolation structure therebetween. Also, in this case, a contact structure 208A may be efficiently formed with respective contacts to the gate electrode 205 and the drain and source regions 204 in a common process sequence.

It should be appreciated that the transistors 200 as shown in FIGS. 2c-2e are of illustrative nature only and any other appropriate transistor architecture may be used, as long as a double channel configuration in the channel region 203 may be provided in combination with an appropriately designed contact area 208 for connecting the body region 202B so as to enable the application of a control voltage to the body region 202B.

FIG. 2f schematically illustrates the device 200 as, for instance, shown in FIG. 2c or 2d during an initial manufacturing stage so as to form the doped region or channel region 203B as a substantially isolated "island." As shown, prior to or after the formation of isolation structures, such as the isolation structures 209A and/or 209B (FIG. 2c), the region 203B may be defined on the basis of an appropriately designed implantation process 211. In other cases, the region 203B may be provided in the form of a doped layer, which may be accomplished on the basis of epitaxial growth techniques, as previously described.

FIG. 2g schematically illustrates the transistor 200 in an advanced manufacturing stage, in which the gate electrode 205 may have been formed, and which may include offset spacer elements 205A, which may be comprised of silicon dioxide, silicon nitride or any other appropriate material. Furthermore, in addition to any other required implantation processes for creating a desired dopant profile within the semiconductor layer 202, thereby defining the body region 202B (FIG. 2c), a tilted halo implantation process 212 may be performed to insert a dopant species providing the same conductivity type as is required for the body region 202. In addition to creating an appropriate dopant gradient between the drain and source regions 204, the halo implantation 212 may also provide a sufficient dopant concentration so as to invert the conductivity type at any region within the semiconductor layer 202 that are not affected by the implantation 212. Hence, after introducing the dopant species, a substantially "island"-like region may be obtained, which may thus represent the channel sub region 203B.

It should be appreciated that any other process technique for creating the doped region 203B may be applied, if it is desired as a substantially isolated channel region. Consequently, for forming the channel region 203, irrespective of whether the doped region 203B is provided in the form of a "connected" channel region connecting to the drain and source regions 204 or an isolated region, such as the region shown in FIGS. 2d-2g, a high degree of compatibility with conventional manufacturing processes for forming field effect transistors may be achieved. Hence, the double channel transistor 200 may be readily implemented into a plurality of semiconductor designs without significant modifications of the overall manufacturing flow.

After completing the transistor 200, a respective contact structure may be formed on the basis of well-established process techniques, if the contact area 208 may be contacted from the front side of the device 200. In other cases, well-established backside contact regimes may be used.

The basic operational behavior of the transistor element 200, for instance in the form of the transistor 200 as shown in FIG. 2c, may be referred to as an N-type transistor. That is, the drain and source regions and the region or channel sub-region 203B may have an N-type conductivity, while the body region may have a P-type conductivity. Hence, appropriate voltages may be applied to the drain and source regions 204, while respective control voltages may be applied to the gate electrode 205 and the body region 202B via the contact area 208. Thus, the conductivity of the channel region 203 may be influenced by both the gate electrode 205 and the body region 202B, thereby obtaining an operational behavior in which the response of the transistor 200 may change from a P-type behavior into an N-type behavior and vice versa. That is, the response of the transistor 200 may be dominated by the control voltage supplied to the body region 202B during certain voltage ranges, while, in other voltage intervals, the transistor response may be substantially determined by the voltage at the gate electrode 205, thereby creating the desired local maximum of a transfer slope.

Figure 3A:
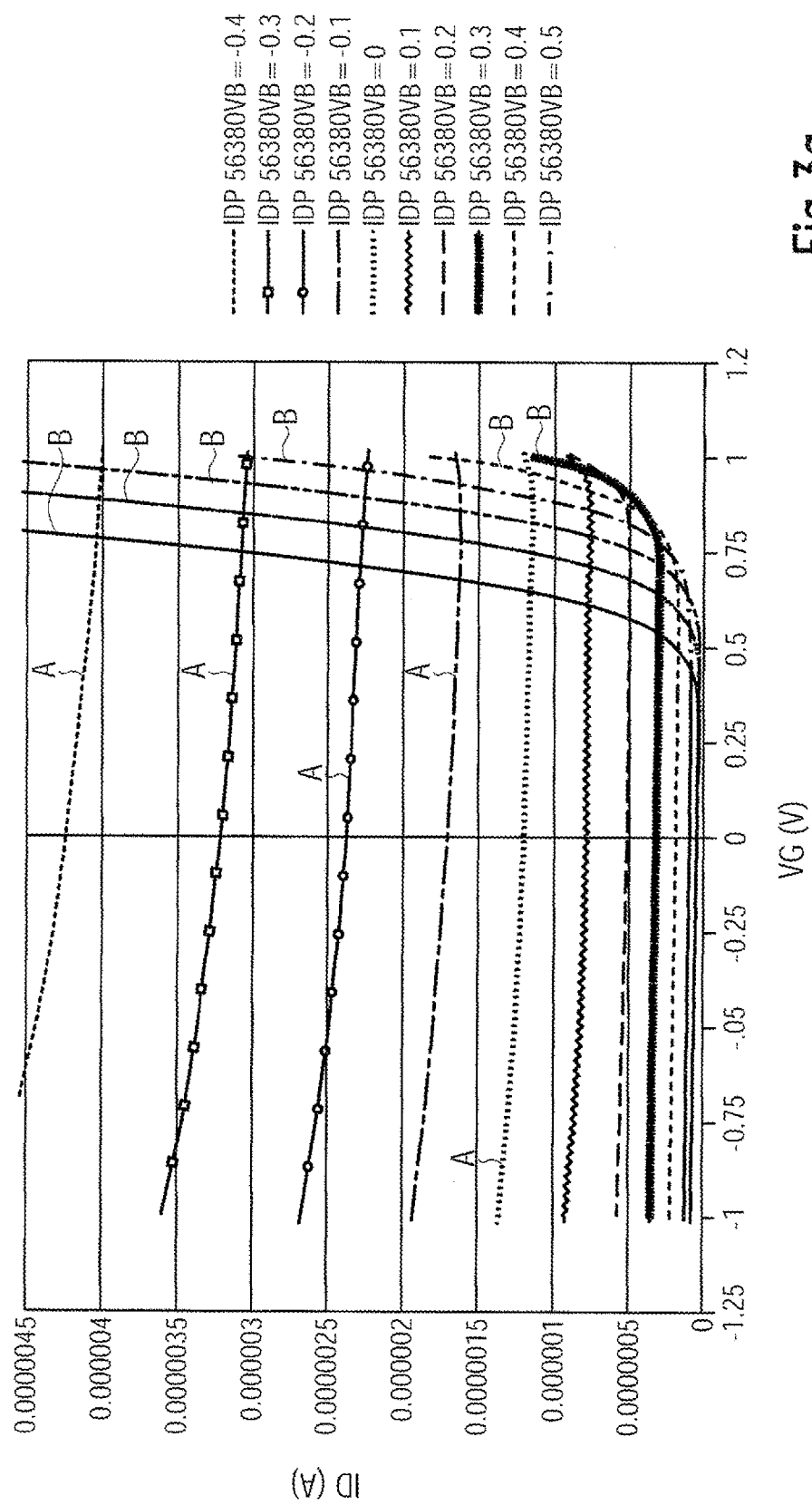
FIGS. 3a-3c schematically illustrate measurement data of respective transfer slopes obtained from N-type and P-type double channel field effect transistors, according to illustrative embodiments.

FIG. 3a schematically illustrates measurement data obtained from the transistor 200 in the form of an N-type transistor, wherein a current (vertical axis) between the drain and source regions is plotted against the control voltage $V_G$ supplied to the gate electrode 205 (horizontal axis), while also a control voltage $V_B$ supplied to the contact area 208 is varied. As illustrated in FIG. 3a, a respective typical transistor behavior may be obtained for the control voltage $V_B$ supplied to the body region 202B in the range of approximately 0-1 volts (for convenience only respective slopes for $V_B$=+0.5 to −0.1 V), wherein a permanent increase of the current may be observed at a specific "threshold voltage," which, however, is shifted with a variation of the body voltage, as illustrated by various curves B having a pronounced increase. On the other hand, increasing the body voltage to higher negative values, the control effect of the gate voltage may be significantly reduced, thereby resulting in only a moderately low dependence of the current on the gate voltage, while, on the other hand, providing a significant current change with a varying control voltage $V_B$ supplied to the body region 202B, as illustrated by curves A.

Figure 3B:
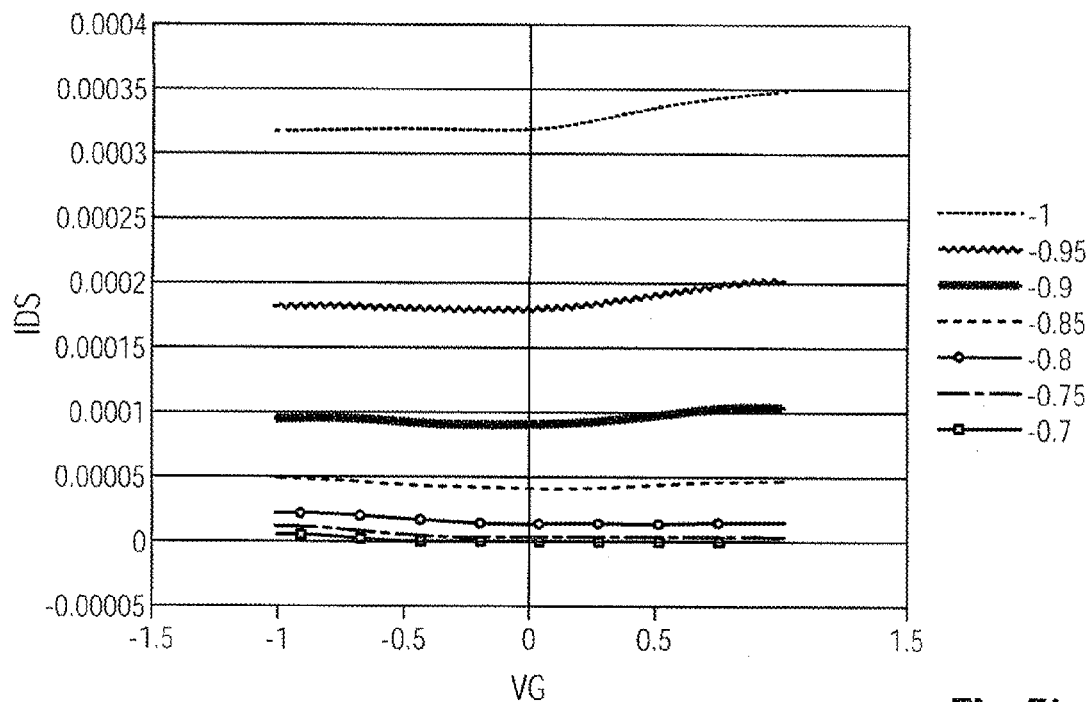
Figure 3C:
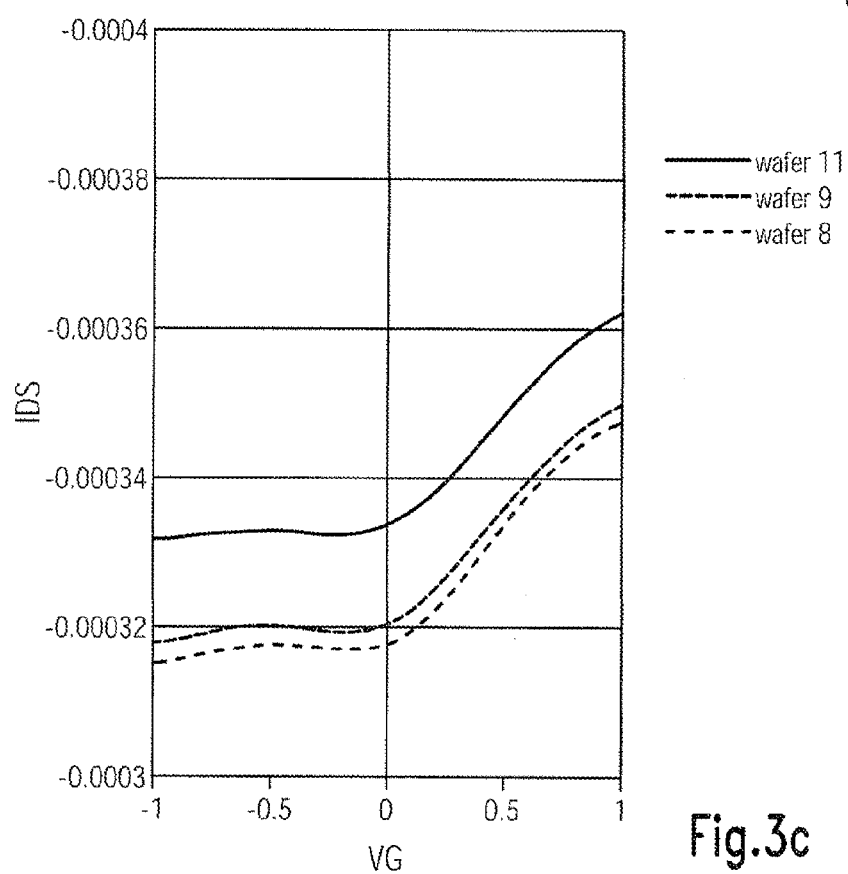

FIGS. 3b and 3c schematically illustrate respective measurement data for a P-type double channel transistor. As illustrated, FIG. 3b represents the drain/source current (vertical axis) for gate voltages (horizontal axis) varied between −1 volt and +1 volt, wherein also the body voltage may be varied between −0.5 to −1 volt. As illustrated, a significant variation of the drain/source current may be obtained with a varying body voltage $V_B$, while only an minor dependency on the gate voltage $V_G$ is obtained.

On the other hand, FIG. 3c schematically illustrates the response of the transistor when the body voltage is at +1 volt, thereby achieving a variation of the current flow with respect to the control voltage $V_G$ supplied to the gate electrode, whereby a substantially N-channel-like behavior may be achieved.

Due to the mutual interaction between the control voltages supplied to the gate electrode 205 and the body region 202B, a more pronounced local maximum in the transfer slope may be accomplished. In this way, new circuit arrangements may be provided with increased functionality and/or reduced space consumption, as will be described next.

Figures 4A, 4B:
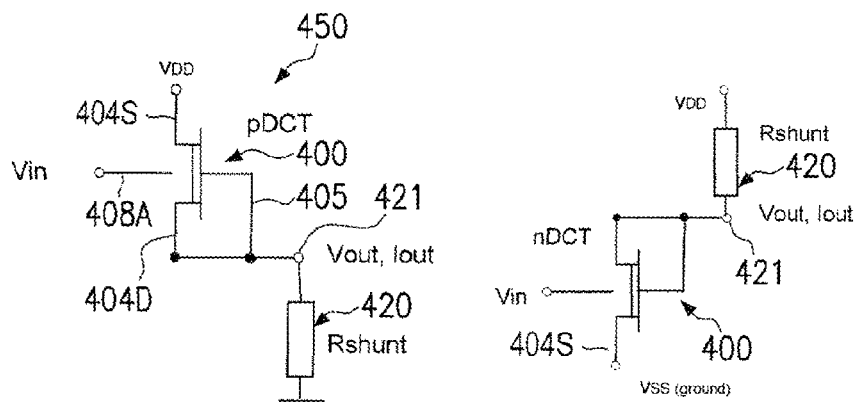
FIGS. 4a and 4b schematically illustrate circuit diagrams of electronic circuits comprising a P-type double channel transistor and an N-type double channel transistor, respectively, in combination with a resistor component to obtain a transfer slope of the circuits having a local maximum, according to illustrative embodiments.

FIG. 4a schematically illustrates a circuit diagram for an electronic circuit including a P-type double channel transistor, similarly as previously explained with reference to FIGS. 2a-2g, which may have an operational behavior as discussed with reference to FIGS. 3b-3c. The electronic circuit 450 may, therefore, comprise a transistor 400 including a gate terminal 405, which may be connected to a drain terminal 404D. On the other hand, a source terminal 404S may be connected to the supply voltage $V_{DD}$. Furthermore, a body contact 408A may be used as an input of the circuit 450. A resistive element, for instance, a shunt resistor 420, may be connected to the transistor 400, that is, to a node 421, which may also act as an output terminal and to which the drain terminal 404D and the gate terminal 405 may also be connected.

FIG. 4b schematically illustrates the circuit 450 in a configuration in which an N-type transistor 400 may be provided. Thus the source terminal 404S may be connected to ground potential, while the resistive element 420 may be connected to the supply voltage $V_{DD}$.

The circuits 450 illustrated in FIGS. 4a and 4b may represent circuit configurations in which a pronounced local maximum and minimum in the transfer slope may be achieved. That is, the response to a varying input voltage connected to the body terminal 408A may result in an output voltage, which may have, contrary to conventional transfer slopes of transistors, a local maximum and a local minimum at a specified voltage range.

Figure 4C:
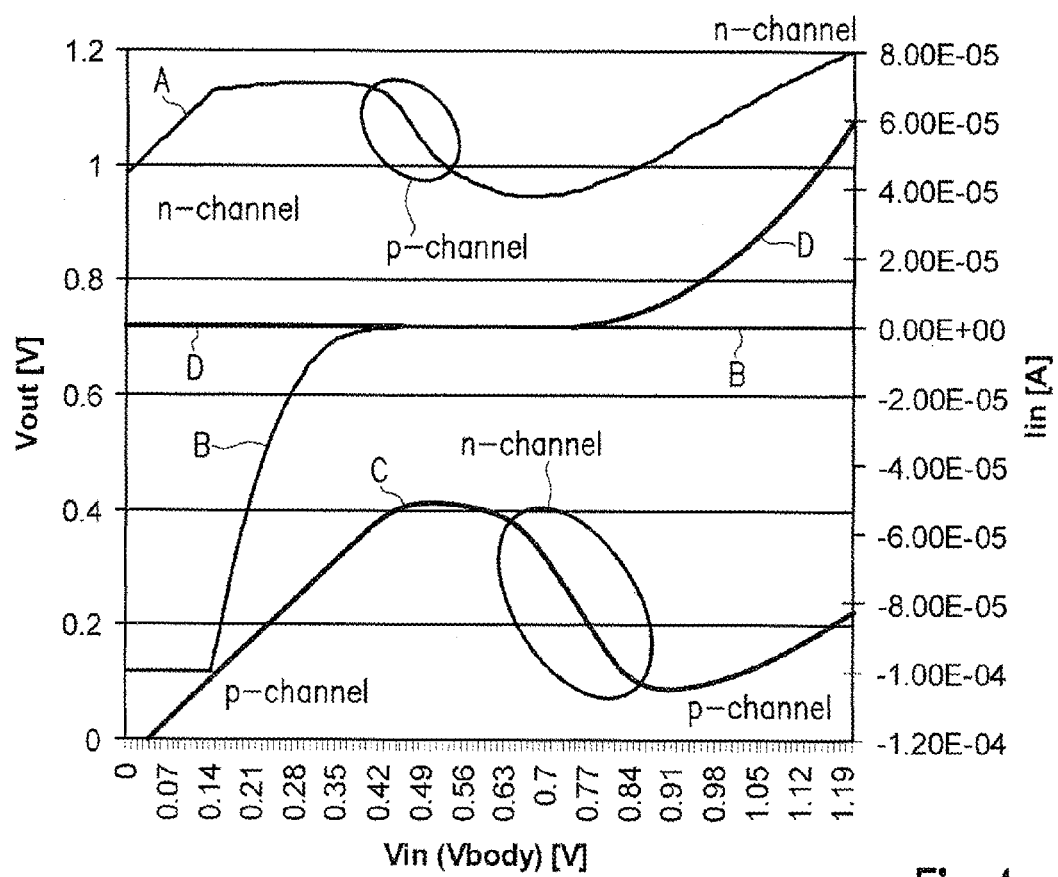
FIG. 4c schematically illustrates measurement data of transfer slopes, i.e., output voltages versus varying input voltages supplied to the body terminal of the circuits of FIGS. 4a and 4b.

FIG. 4c schematically illustrates respective measurement data obtained from the circuits 450 as shown in FIGS. 4a and 4b. The horizontal axis represents the input voltage relative to the reference potential, such as ground potential. The vertical axis on the left-hand side represents the output voltage obtained at the circuit nodes 421. The vertical axis at the right-hand side represents the input current flowing through the body contacts 408A.

Curve A in FIG. 4c represents the transfer slope, i.e., the progression of the output voltage obtained at the node 421 of the circuit 450 of FIG. 4a. As illustrated, on the left-hand side, an increase of the output voltage and thus a reduction of the conductivity of the transistor 400 may be obtained with increasing input voltage. Hence, a substantially N-channel transistor-like behavior may be obtained in this range of input voltages. After an interval of a less pronounced increase, the output voltage may drop with increasing input voltage, which may represent a P-type channel transistor since the conductivity of the transistor 400 may decrease with increasing input voltage. By further increasing the input voltage, a further increase of the output voltage may be observed, which may also be considered as an N-channel-like behavior. Consequently, due to the area corresponding to N-channel-like behavior enclosed by areas corresponding to P-channel behavior, a pronounced maximum in the conductivity, and thus a minimum in the output voltage, may be obtained.

Curve B in FIG. 4c represents the measured input current drawn via the body contact 408A, which may have the pronounced negative value at low input voltages and which may significantly drop in magnitude to achieve substantially zero at an area corresponding to the P-channel behavior.

Similarly, Curve C represents the transfer slope of the circuit 450 in FIG. 4b including the N-type double channel transistor 400. As illustrated, starting with a low input voltage, an increase of output voltage may be obtained with increasing input voltage, thereby representing a P-channel-like behavior, since the conductivity drops as the input voltage is increased. At an input voltage of approximately 0.6 volts, the output voltage may decrease with increasing input voltage, thereby indicating an N-channel-like behavior since the conductivity of the transistor 400 increases with increasing input voltage. During further increasing of the input voltage again, a substantially P-channel-like behavior may be obtained, since the conductivity of the transistor 400 may decrease with increasing input voltage, thereby resulting in an increase of the output voltage.

From the basic circuit configurations 450, other circuits may be defined as will be described next.

Figure 5A:
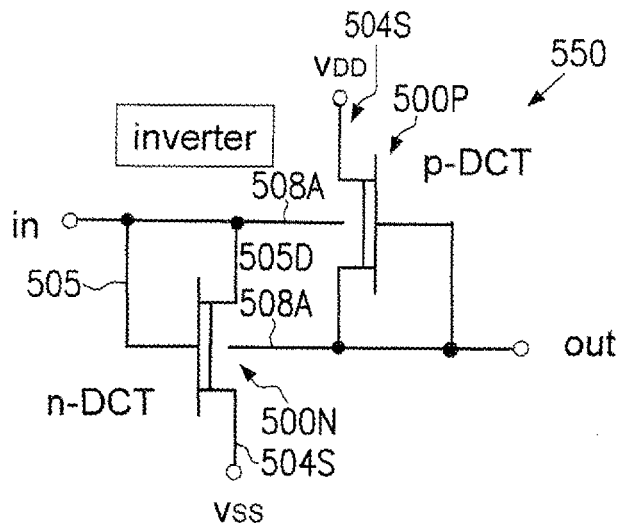
FIGS. 5a and 5b schematically illustrate a circuit diagram of an inverter and a corresponding transfer slope, according to illustrative embodiments.

FIG. 5a schematically illustrates an electronic circuit 550, in which a P-type double channel transistor and an N-type double channel transistor are combined, for instance, so as to act as respective resistive loads, as, for instance, explained with reference to the circuits 450, thereby obtaining an inverter function. As shown, the inverter 550 may comprise an N-type channel transistor 500N which may have the same configuration as previously explained. Similarly, a P-type double channel transistor 500P may be provided having a configuration as previously explained. The signal input may be connected to a body contact 508A of the transistor 500P. On the other hand, a signal output may be connected to the body contact 508A of the transistor 500N. Moreover, the source 504S of the transistor 500N is connected to ground potential or negative supply voltage $V_{SS}$, while gate and drain 505 and 504D are connected to the input node, and thus to the body contact 508A of the transistor 500P. The source 5045 of the P-type double channel transistor 500P is connected to the supply voltage $V_{DD}$, while drain and gate 504D and 505 are connected to the output node.

Figure 5B:
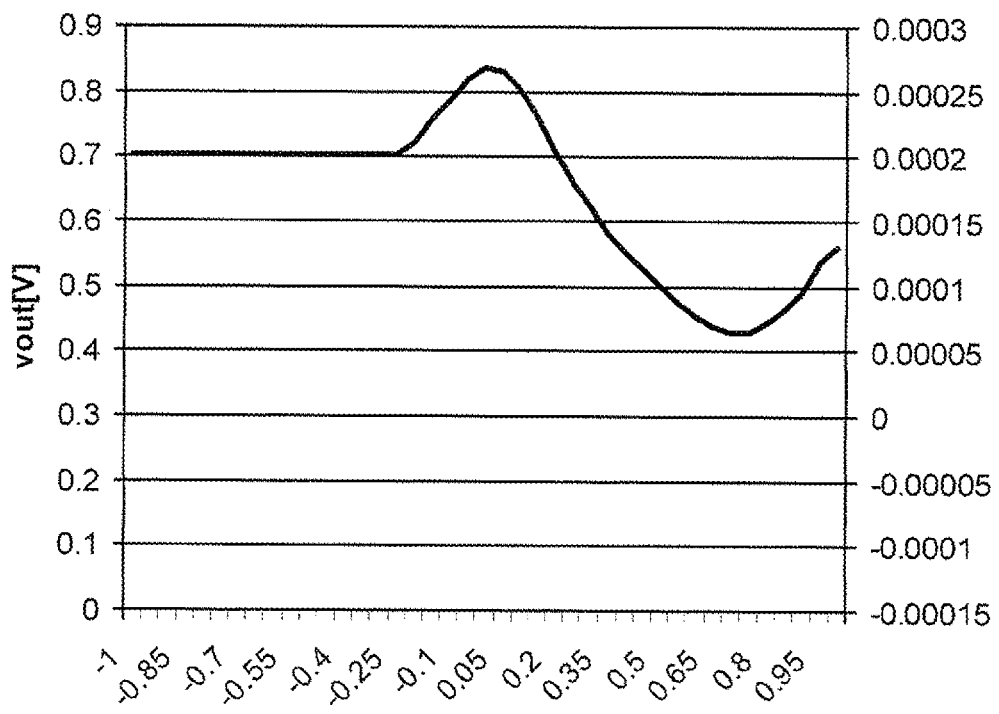

FIG. 5b schematically illustrates the response of the inverter 550 to an input voltage varying between −1.0 and 1.0 V. As illustrated, the inverter 550 may comprise three well-defined and different output values wherein, for input voltages of −1 to approximately 0.5, a "high level" of approximately 0.7 volts may be obtained. Furthermore, a further "high level" may be obtained for an input voltage of approximately 0.1 volt, while a "low level" may be achieved for an input voltage of approximately 0.8 volts. Hence, the behavior of the inverter 550 may, for instance, be used for an oscillator circuit when a portion of the output signal is appropriately fed back to the input. Moreover, the circuit 550 may be incorporated into logic circuits, thereby providing a plurality of logic states, which may be used for enhancing overall circuit efficiency, since more logic states may be realized on the basis of a reduced number of circuit elements.

Figure 5C:
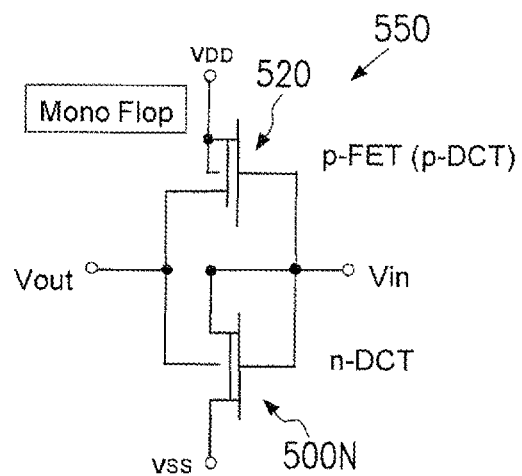
FIGS. 5c and 5d schematically illustrate a circuit diagram of a monoflop circuit and a measured signal slope, according to still further illustrative embodiments.

FIG. 5c schematically illustrates the circuit 550 according to a further illustrative embodiment in which a "monoflop" circuit may be formed by using at least one double channel transistor having a controllable body contact. In the circuit 550 shown, an N-type double channel transistor 550 may be provided in combination with a further circuit element 520, such as a P-channel transistor, which may be represented by a conventional single channel field effect transistor or by a double channel transistor, wherein the body contact may be connected to the source of the transistor 520. As shown, the input node $V_{in}$ may be connected to the gate and drain 505, 504D and also to the gate of the transistor 520. On the other hand, the output voltage node $V_{out}$ may be connected to the body contact 508A and to the drain of the transistor 520. It should be appreciated that the circuit 550 as shown in FIG. 5c may also be provided on the basis of a P-type double channel transistor, where, in this case, the "load transistor" 520 may be replaced by an N-channel transistor.

Figure 5D:
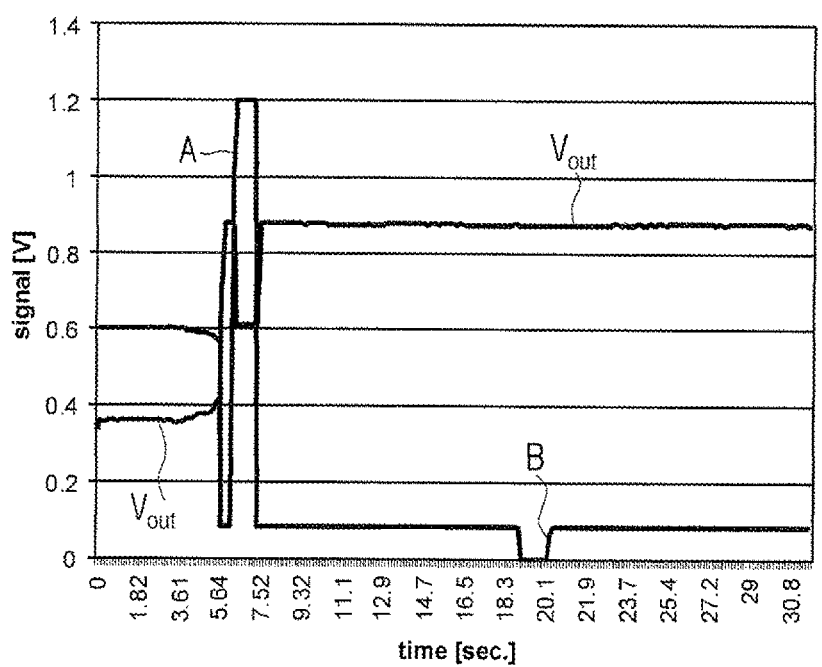

FIG. 5d schematically illustrates a diagram illustrating the voltages at the input node $V_{in}$, and the output node $V_{out}$ after the application of a pulse for initially setting the output of the monoflop 550 that corresponds to approximately 0.85 volts. This state may be stable, independent of further input pulses, such as pulse A to $V_{DD}$ or pulse B to $V_{SS}$. Hence, once set, the circuit 550 may remain in this state without responding to a variation of the input voltage.

Figure 5E:
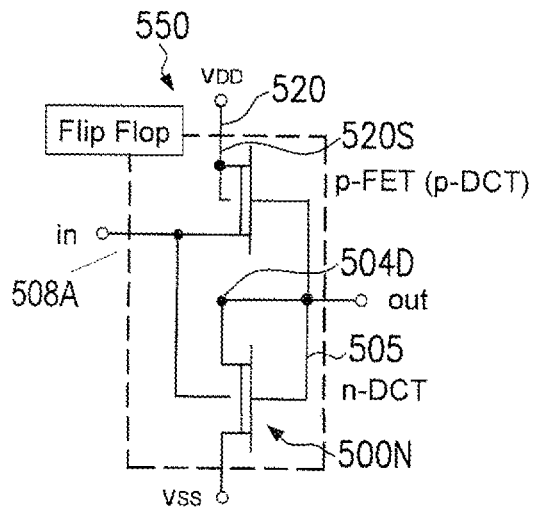
FIGS. 5e and 5f schematically illustrate circuit diagrams representing flip flop circuits with a separate input and output (FIG. 5e) and a common input and output (FIG. 5f) on the basis of two transistors, according to illustrative embodiments.

FIG. 5e schematically illustrates the electronic circuit 550 according to further illustrative embodiments. Basically, the circuit 550 may correspond to the circuit 550 of FIG. 5c, while merely input and output are interchanged with each other. That is, the circuit 550 as shown in FIG. 5e may comprise the N-type double channel transistor 500N, which is connected to the P-channel transistor 520, which may be provided as a conventional single channel transistor or a P-type double channel transistor having its control input connected to the source terminal 520S. Hence, the input node IN is connected to the body contact 508A while the output OUT is connected to drain and gate 504D, 505. In this manner, the circuit 550 may be considered as a flip flop circuit in which an input pulse at a moderately high or low voltage, such as $V_{DD}$ or $V_{SS}$, may set the circuit 550, i.e., the output thereof, into two different stable states.

Figure 5F:
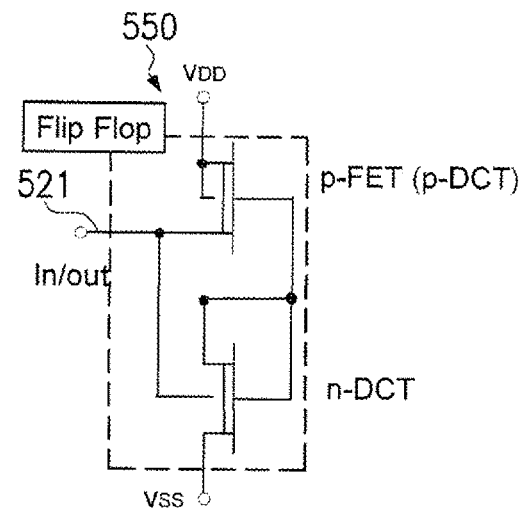

FIG. 5f schematically illustrates the circuit 550 according to further illustrative embodiments, which may have basically the same configuration as shown in FIG. 5e, wherein, however, a node 521 may be used as an input and an output node.

Figure 5I:
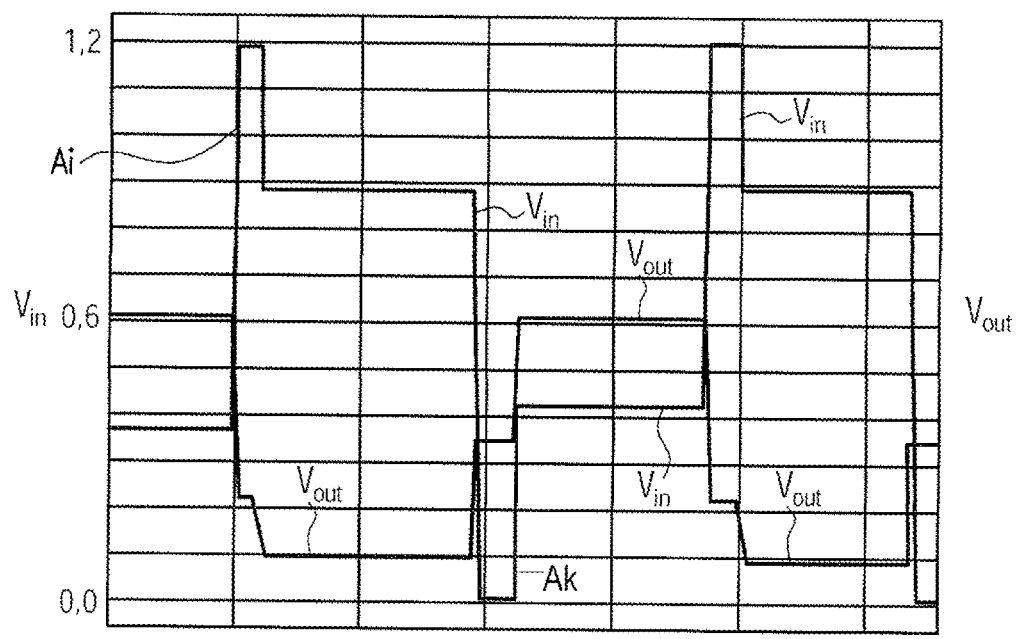
FIG. 5i schematically illustrates a measured signal response of the flip flop circuit of FIG. 5e, according to illustrative embodiments.
Figure 5G:
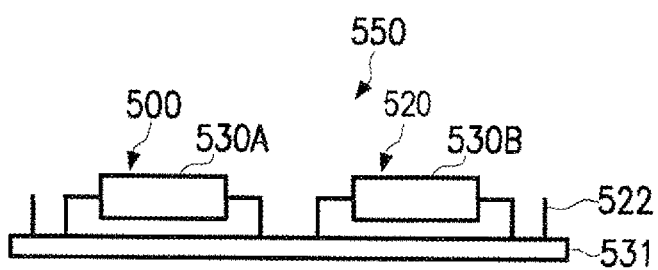
FIGS. 5g and 5h schematically illustrate an electronic circuit according to discrete circuit elements and a double channel transistor formed on a carrier substrate, according to illustrative embodiments.

FIG. 5g schematically illustrates the circuit 550 according to further illustrative embodiments, in which the respective components, that is, the double channel transistor 500 and the further circuit element 520 may be provided as discrete devices. Thus, the circuit 550 of FIG. 5g may comprise the transistor 500 including a package 530A, which may represent any appropriate carrier material for accommodating a semiconductor chip including the transistor configuration, as previously described, in combination with an appropriate contact metallization structure. Similarly, the circuit component 520, for instance in the form of a double channel transistor, a single channel transistor, a resistive structure and the like, may also be provided with a package 530B having any appropriate configuration. Furthermore, respective nodes or contact elements 522 may be attached, together with the packages 530A, 530B, to a substrate material 531, for instance, a printed wiring board and the like.

Figure 5H:
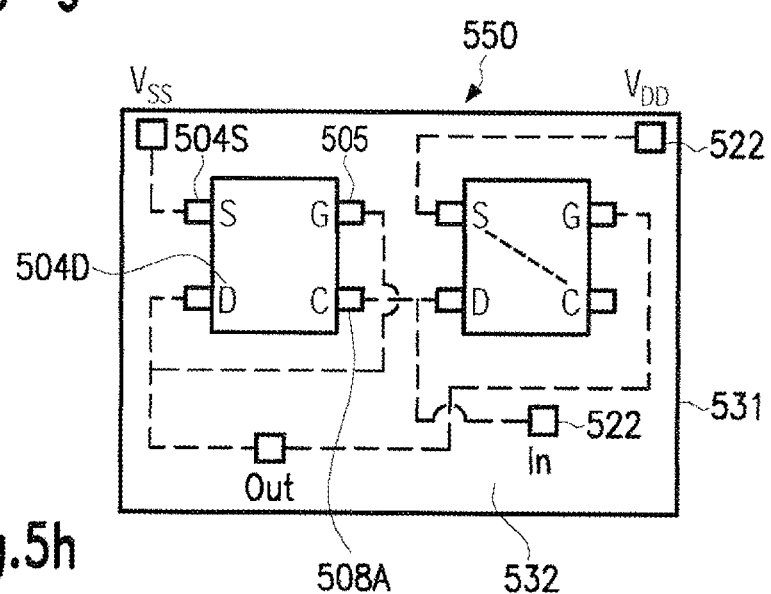

FIG. 5h schematically illustrates the electronic circuit 550 in a schematic top view, wherein the respective terminals, that is, the gate terminal 505, the drain and source terminals 504D, 504S and the body terminal 508A are electrically connected to a wiring system 532 formed in or on the carrier substrate 531. Similarly, the circuit element 520 may be appropriately connected to the transistor 500 and the respective nodes 521, such as the supply voltages $V_{SS}$ and $V_{DD}$, IN and OUT according to the specified circuit configuration. For example, as shown, the wiring regime may correspond to the flip flop circuit as shown in FIG. 5e.

Hence, highly efficient circuit elements may be formed on the basis of discrete devices by using double channel transistors having a controllable body contact. It should be appreciated, however, that the electronic circuits 550, for instance as shown in FIGS. 5g and 5h, may additionally comprise further circuit components to provide a complete circuit configuration according to specific criteria. In other illustrative embodiments, the circuits 550, as previously explained, and any other circuit including respective double channel transistors comprising a controllable body contact, may be integrated into common semiconductor substrates, thereby efficiently saving on valuable semiconductor area since the enhanced functionality may enable more efficient circuit configurations. For example, the flip flop circuits 550, as previously explained, may be efficiently used as basic components of memory cells, thereby significantly reducing the number of transistor elements required in a static RAM area.

FIG. 5i schematically illustrates a measured signal response of the flip flop circuit 550 as shown in FIG. 5e. The horizontal axis may represent the time, while the vertical axis on the left-hand side represents the voltage at the input node IN and the vertical axis on the right-hand side represents the voltage at the output node OUT. As illustrated, after applying an external pulse, for instance, to $V_{DD}$ of approximately 1.2 volts, indicated as Ai, the circuit responses at the output in a similar manner as previously explained with reference to FIG. 4c when referring to the circuit 450 in FIG. 4b. Thus, in this case, the transistor 520 may be considered as a resistive load so that the response is substantially determined by the behavior of the double channel transistors 500, as previously explained with reference to FIGS. 4b and 4c. Hence, the application of the input pulse Ai, therefore, results in an output voltage of approximately 0.2 volts (see FIG. 4c, Curve C). After the end of the pulse Ai, the circuit takes on the stable state at the minimum of Curve C of FIG. 4c that corresponds to substantially 0.1 volt, while the voltage at the body contact 508A, i.e., the output voltage node, may be at approximately 0.85 volts. As illustrated, the corresponding state is stable and may therefore be used for storing an information. On the other hand, an input pulse Ak to $V_{SS}$ may force the output node to a voltage of approximately 0.35 volts. After the end of the pulse Ak, the P-channel behavior of the transistor 500 in this range of input voltages may thus result in a further increase of the voltage at the output node, since the P-channel transistor pulls the input of the transistor 500 to a higher voltage level. As illustrated, this state is also stable and may be "read out" from the circuit 550.

Figure 5J:
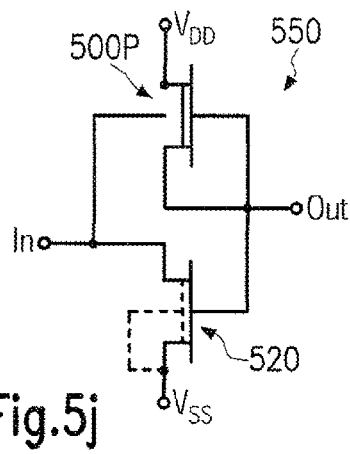
FIGS. 5j and 5k schematically illustrate respective flip flop circuits formed on the basis of a P-type double channel transistor, according to illustrative embodiments.

FIG. 5j schematically illustrates the flip flop 550 according to a further illustrative embodiment, wherein the P-type double transistor 500P is used in a configuration with a separate input node and output node similar to the circuit 550 of FIG. 5e. Hence, a single channel transistor 520 or an N-type double channel transistor with its body contact connected to the source terminal, as indicated by the dashed lines, may be used as the complementary transistor of the flip flop.

Figure 5K:
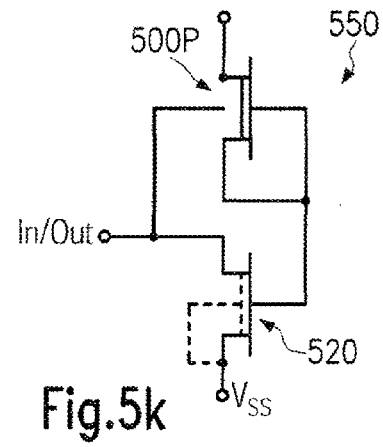

FIG. 5k schematically illustrates the circuit 550 corresponding to the flip flop with a common input/output node, as, for instance, shown in FIG. 5f, wherein also in this case, a P-type double channel transistor 500P may be used in combination with an N-channel transistor, possibly provided in the form of an N-type double channel transistor with its body contact connected to the source terminal, as previously explained.

Consequently, a plurality of circuits may be formed on the basis of body controlled N-type and P-type double channel transistors, wherein a high information density may be achieved in advanced semiconductor devices in which static RAM areas have to be provided.

Figure 5L:
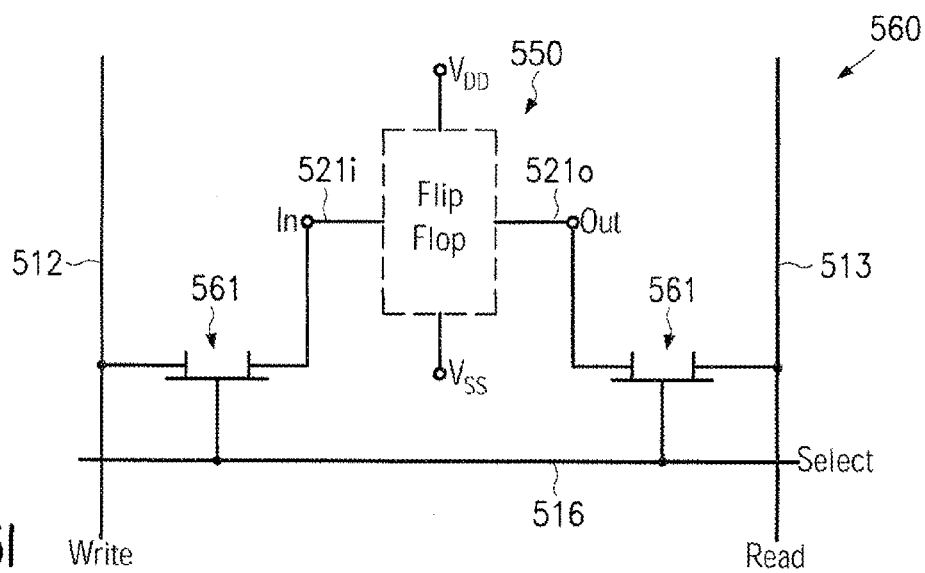
FIGS. 5l and 5m schematically illustrate circuit diagrams of memory cells, that is, static memory cells including a reduced number of transistor elements, according to further illustrative embodiments.

FIG. 5l schematically illustrates an electronic circuit representing a RAM cell 560, which may comprise one of the flip flop circuits 550, as previously explained with reference to FIGS. 5e and 5j. Thus, the flip flop circuit 550 may comprise an input node 521i and an output node 521o, which may be connected to a write line 512 and a read line 513, respectively, via corresponding select transistors 561, which both may be connected to a select line 516. Consequently, the memory cell 560 may be formed on the basis of four transistor elements, that is, two select transistors 561, one double channel transistor and an additional transistor 520, which may be provided in the form of a single channel transistor or a double channel transistor, as previously explained. Since the body controlled double channel transistors may be formed on the basis of conventional techniques with a high degree of compatibility with conventional semiconductor manufacturing techniques, as previously explained, the RAM cell 560 may be formed in accordance with well-established process techniques, thereby saving approximately one third of the area required by conventional RAM cells including six transistors.

Figure 5M:
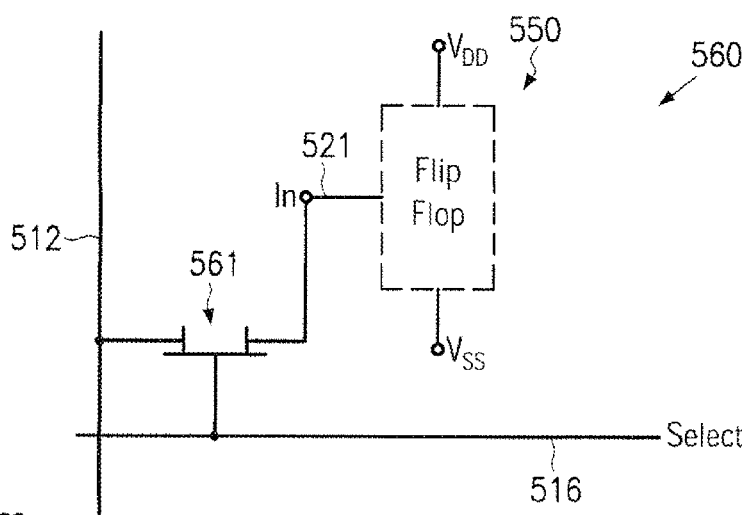

FIG. 5m schematically illustrates the memory cell 560 according to further illustrative embodiments in which the flip flop circuit 550, according to the arrangement as described with reference to FIGS. 5f and 5k, may be used. Hence, in this case, a single input/output node 521 may provide a simplified overall configuration of the memory cell 560. For instance, a single select transistor 561 may be used in combination with the select line 516 and a single bit line 512. In this case, an even further enhanced reduction of the overall semiconductor area required by the memory cell 560 may be accomplished.

Consequently, the memory cells 560 may be advantageously implemented into complex semiconductor devices including extended memory areas, wherein a short access time, as is typical for static RAM cells, may be combined with a significantly reduced space consumption, due to the reduced number of transistors required.

As a result, the principles disclosed herein relate to double channel transistors with a body terminal for supplying a control voltage thereto, thereby obtaining a highly stable operational behavior with respect to a local maximum or minimum in the transfer slope of the transistor. Thus, new circuit configurations may be provided in which the extended functionality of the body controlled double channel transistor may provide the possibility of obtaining circuit functions with a reduced number of components, for instance for flip flops, oscillators, monoflops and the like, thereby enhancing the efficiency of the overall circuit configurations, irrespective of whether the body controlled double channel transistor may be provided as a separate component or may be incorporated into complex semiconductor devices. In illustrative embodiments, a static RAM cell may be provided in which a reduced number of transistor elements may enable higher information density, thereby enabling the fabrication of semiconductor devices including an increased number of memory cells for a given semiconductor area.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

The invention claimed is:

1. A static RAM cell, comprising:
   a select transistor having a gate configured to receive a select signal and an input configured to receive at least one of a read signal and a write signal; and
   a first field effect transistor comprising:
   a gate electrode;
   a terminal coupled to the gate electrode;
   a drain region and a source region having a first conductivity type adjacent the gate electrode;
   a first body region defined between said drain region and said source region and having a second conductivity type that is other than said first conductivity type, wherein said body region is connected to an output of said select transistor to enable selective application of said at least one of a read signal and a write signal to said first body region responsive to said select signal.

2. The static RAM cell of claim 1, further comprising a second field effect transistor connected to said first field effect transistor, said first and second field effect transistors forming a flip flop circuit for data storage.

3. The static RAM cell of claim 2, wherein said flip flop circuit comprises an input for receiving said read signal and said write signal.

4. The static RAM cell of claim 2, wherein said flip flop circuit comprises an input connected to said first body region and an output connect to a gate electrode of said first field effect transistor.

5. The static RAM cell of claim 4, wherein said output is connected a drain of said first field effect transistor and a gate electrode of said second field effect transistor.

6. The static RAM cell of claim 5, wherein said input is connected to a drain of said second field effect transistor.

7. The static RAM cell of claim 6, wherein said second field effect transistor comprises a second body region coupled to a source of said second field effect transistor.

8. The static RAM cell of claim 1, wherein said first field effect transistor comprises a doped region located between said drain region and said source region, wherein said doped region has said first conductivity type.

9. The static RAM cell of claim 8, further comprising a second field effect transistor coupled to said first field effect transistor, said second field effect transistor comprising a second body region having said first conductivity type and a second doped region comprising said second conductivity type.

10. The static RAM cell of claim 1, wherein the select transistor is coupled to a bit line for receiving said at least one read or write signal, further comprising a second field effect transistor connected to said first field effect transistor, said first and second field effect transistors forming a flip flop circuit for data storage, wherein said flip flop circuit comprises an input/output terminal connected to said first body region and a drain of said second field effect transistor.

11. The static RAM cell of claim 10, wherein a gate of said first field effect transistor, a gate of said second field effect transistor, and a drain of said second field effect transistor are coupled together.

12. The static RAM cell of claim 11, wherein said second field effect transistor comprises a second body region coupled to a source of said second field effect transistor.

* * * * *